United States Patent
Volodin et al.

(10) Patent No.: US 9,793,674 B2
(45) Date of Patent: Oct. 17, 2017

(54) CHIRPED BRAGG GRATING ELEMENTS

(71) Applicant: PD-LD, Inc., Pennington, NJ (US)

(72) Inventors: Boris Leonidovich Volodin, West Windsor, NJ (US); Vladimir Sinisa Ban, Princeton, NJ (US)

(73) Assignee: NECSEL INTELLECTUAL PROPERTY, INC., Pennington, NJ (US)

( * ) Notice: Subject to any disclaimer, the term of this patent is extended or adjusted under 35 U.S.C. 154(b) by 0 days.

(21) Appl. No.: 13/629,899

(22) Filed: Sep. 28, 2012

(65) Prior Publication Data
US 2014/0029641 A1    Jan. 30, 2014

Related U.S. Application Data

(60) Division of application No. 11/407,795, filed on Apr. 19, 2006, now Pat. No. 8,306,088, which is a
(Continued)

(51) Int. Cl.
*H01S 3/08*      (2006.01)
*H01S 3/00*      (2006.01)
(Continued)

(52) U.S. Cl.
CPC ........ *H01S 3/0057* (2013.01); *G02B 19/0014* (2013.01); *G02B 19/0057* (2013.01);
(Continued)

(58) Field of Classification Search
CPC .............. H01S 3/08009; H01S 3/0057; H01S 3/08031; H01S 3/109; H01S 3/08013
(Continued)

(56) References Cited

U.S. PATENT DOCUMENTS

| 3,145,252 A | 8/1964 | Herriott |
| 3,396,343 A | 8/1968 | Wesselink |

(Continued)

FOREIGN PATENT DOCUMENTS

| EP | 0310438 A1 | 4/1989 |
| EP | 0322218 A2 | 6/1989 |

(Continued)

OTHER PUBLICATIONS

"In the United States District Court for the District of New Jersey", Case No. 08-cv-03494, Third Party Complaint by Defendant Ondax, Inc. Against *Arasor International Limited* and Jury Demand, Aug. 22, 2008, 9 pages.
(Continued)

*Primary Examiner* — Kinam Park
(74) *Attorney, Agent, or Firm* — Condo Roccia Koptiw LLP

(57) ABSTRACT

Apparatus and methods for altering one or more spectral, spatial, or temporal characteristics of a light-emitting device are disclosed. Generally, such apparatus may include a volume Bragg grating (VBG) element that receives input light generated by a light-emitting device, conditions one or more characteristics of the input light, and causes the light-emitting device to generate light having the one or more characteristics of the conditioned light.

13 Claims, 29 Drawing Sheets

Related U.S. Application Data continuation of application No. 10/884,524, filed on Jul. 2, 2004, now Pat. No. 7,298,771.

(60) Provisional application No. 60/484,857, filed on Jul. 3, 2003, provisional application No. 60/564,526, filed on Apr. 22, 2004.

(51) Int. Cl.
    *G02B 27/09*     (2006.01)
    *H01S 5/14*     (2006.01)
    *G02B 19/00*     (2006.01)
    *H01S 3/109*     (2006.01)
    *H01S 5/00*     (2006.01)
    *H01S 5/065*     (2006.01)
    *H01S 5/40*     (2006.01)

(52) U.S. Cl.
    CPC ...... *G02B 27/0944* (2013.01); *H01S 3/08009* (2013.01); *H01S 3/08013* (2013.01); *H01S 5/141* (2013.01); *H01S 5/4062* (2013.01); *H01S 3/08031* (2013.01); *H01S 3/109* (2013.01); *H01S 5/005* (2013.01); *H01S 5/0654* (2013.01); *H01S 5/0656* (2013.01); *H01S 5/143* (2013.01); *H01S 5/405* (2013.01); *H01S 5/4012* (2013.01); *H01S 5/4068* (2013.01); *H01S 5/4087* (2013.01)

(58) Field of Classification Search
    USPC .................................. 372/25, 102, 98, 41
    See application file for complete search history.

(56) References Cited

U.S. PATENT DOCUMENTS

| | | |
|---|---|---|
| 3,580,657 A | 5/1971 | Sheridon |
| 3,603,690 A | 9/1971 | Hard |
| 3,647,289 A | 3/1972 | Weber |
| 3,936,143 A | 2/1976 | Sato |
| 4,013,388 A | 3/1977 | Stratman |
| 4,017,318 A | 4/1977 | Pierson et al. |
| 4,037,919 A | 7/1977 | Takeda et al. |
| 4,057,408 A | 11/1977 | Pierson et al. |
| 4,095,875 A | 6/1978 | Lee et al. |
| 4,215,937 A | 8/1980 | Borsuk |
| 4,239,333 A | 12/1980 | Dakss et al. |
| 4,398,797 A | 8/1983 | Wedertz et al. |
| 4,514,053 A | 4/1985 | Borrelli et al. |
| 4,714,902 A | 12/1987 | Rokni et al. |
| 4,719,635 A | 1/1988 | Yeh |
| 4,737,946 A | 4/1988 | Yamashita et al. |
| 4,747,657 A | 5/1988 | Chaoui et al. |
| 4,826,270 A | 5/1989 | Opheij et al. |
| 4,834,474 A | 5/1989 | George et al. |
| 4,896,933 A | 1/1990 | Yano et al. |
| 4,923,271 A | 5/1990 | Henry et al. |
| 4,942,102 A | 7/1990 | Keys et al. |
| 4,943,126 A | 7/1990 | Lang et al. |
| 4,946,245 A | 8/1990 | Chamberlin et al. |
| 5,020,153 A | 5/1991 | Choa et al. |
| 5,115,338 A | 5/1992 | Digiovanni et al. |
| 5,335,098 A | 8/1994 | Leyva et al. |
| 5,386,426 A | 1/1995 | Stephens |
| 5,440,669 A | 8/1995 | Rakuljic et al. |
| 5,452,124 A | 9/1995 | Baker |
| 5,452,312 A | 9/1995 | Yamamoto et al. |
| 5,491,570 A | 2/1996 | Rakuljic et al. |
| 5,499,134 A * | 3/1996 | Galvanauskas ...... G02B 6/2713 359/333 |
| 5,521,748 A | 5/1996 | Sarraf |
| 5,548,676 A | 8/1996 | Savage, Jr. |
| 5,555,253 A | 9/1996 | Dixon |
| 5,592,333 A | 1/1997 | Lewis |
| 5,619,245 A | 4/1997 | Kessler et al. |
| 5,619,609 A | 4/1997 | Pan et al. |
| 5,633,736 A | 5/1997 | Griffith et al. |
| 5,637,868 A | 6/1997 | Tamiya |
| 5,648,946 A | 7/1997 | Yamazaki |
| 5,655,040 A | 8/1997 | Chesnoy et al. |
| 5,684,611 A | 11/1997 | Rakuljic et al. |
| 5,691,989 A | 11/1997 | Rakuljic et al. |
| 5,757,487 A | 5/1998 | Kersey |
| 5,777,763 A | 7/1998 | Tomlinson, III |
| 5,787,107 A | 7/1998 | Leger et al. |
| 5,796,096 A | 8/1998 | Rakuljic et al. |
| 5,798,859 A | 8/1998 | Colbourne et al. |
| 5,802,092 A | 9/1998 | Endriz |
| 5,808,803 A | 9/1998 | Ullmann et al. |
| 5,812,258 A | 9/1998 | Pierson |
| 5,825,792 A | 10/1998 | Villeneuve et al. |
| 5,867,304 A * | 2/1999 | Galvanauskas ....... H01S 3/2308 359/25 |
| 6,055,250 A | 4/2000 | Doerr et al. |
| 6,064,685 A | 5/2000 | Bissessur et al. |
| 6,093,927 A | 7/2000 | Wickham |
| 6,122,043 A | 9/2000 | Barley |
| 6,163,391 A | 12/2000 | Curtis et al. |
| 6,184,987 B1 | 2/2001 | Jang et al. |
| 6,198,759 B1 | 3/2001 | Broderick et al. |
| 6,221,566 B1 | 4/2001 | Kohnke et al. |
| 6,249,624 B1 | 6/2001 | Putnam et al. |
| 6,269,203 B1 | 7/2001 | Davies et al. |
| 6,285,813 B1 | 9/2001 | Schultz et al. |
| 6,385,219 B1 | 5/2002 | Sonoda et al. |
| 6,385,228 B1 | 5/2002 | Dane et al. |
| 6,411,323 B1 | 6/2002 | Waarts et al. |
| 6,414,973 B1 | 7/2002 | Hwu et al. |
| 6,434,175 B1 | 8/2002 | Zah et al. |
| 6,462,883 B1 | 10/2002 | Wang et al. |
| 6,470,120 B2 | 10/2002 | Green et al. |
| 6,476,345 B1 | 11/2002 | Sator |
| 6,524,913 B1 | 2/2003 | Lin et al. |
| 6,529,675 B1 | 3/2003 | Hayden et al. |
| 6,580,850 B1 | 6/2003 | Kazarinov et al. |
| 6,584,133 B1 | 6/2003 | Walker et al. |
| 6,586,141 B1 | 7/2003 | Efimov et al. |
| 6,591,038 B1 | 7/2003 | Pezeshki |
| 6,594,090 B2 | 7/2003 | Kruschwitz et al. |
| 6,673,493 B2 | 1/2004 | Gan et al. |
| 6,673,497 B2 | 1/2004 | Efimov et al. |
| 6,687,036 B2 | 2/2004 | Riza |
| 6,829,067 B2 | 12/2004 | Psaltis et al. |
| 6,876,475 B1 | 4/2005 | Trisnadi et al. |
| 6,941,052 B2 | 9/2005 | Viswanathan et al. |
| 6,950,454 B2 | 9/2005 | Kruschwitz et al. |
| 7,016,393 B2 | 3/2006 | Anikitchev et al. |
| 7,031,573 B2 | 4/2006 | Volodin et al. |
| 7,125,632 B2 | 10/2006 | Volodin et al. |
| 7,167,490 B2 | 1/2007 | Mehuys et al. |
| 7,184,616 B2 | 2/2007 | Mead et al. |
| 7,212,554 B2 | 5/2007 | Zucker et al. |
| 7,230,968 B2 | 6/2007 | Imai et al. |
| 7,248,617 B2 | 7/2007 | Volodin et al. |
| 7,248,618 B2 | 7/2007 | Volodin et al. |
| 7,298,771 B2 | 11/2007 | Volodin et al. |
| 7,324,286 B1 | 1/2008 | Glebov et al. |
| 7,326,500 B1 | 2/2008 | Glebov et al. |
| 2001/0016099 A1 | 8/2001 | Shin et al. |
| 2001/0028483 A1 | 10/2001 | Buse |
| 2002/0012377 A1 | 1/2002 | Suganuma et al. |
| 2002/0045104 A1 | 4/2002 | Efimov et al. |
| 2002/0176126 A1 | 11/2002 | Psaltis et al. |
| 2002/0192849 A1 | 12/2002 | Bullington et al. |
| 2003/0174749 A1 | 9/2003 | Capasso et al. |
| 2003/0214700 A1 | 11/2003 | Sidorin et al. |
| 2003/0219205 A1 | 11/2003 | Volodin et al. |
| 2004/0004746 A1 | 1/2004 | Riza |
| 2004/0091001 A1 | 5/2004 | Sochava et al. |
| 2004/0120643 A1 | 6/2004 | Viswanathan et al. |
| 2004/0207913 A1 | 10/2004 | Mehuys et al. |
| 2005/0018743 A1 | 1/2005 | Volodin et al. |
| 2005/0027466 A1 | 2/2005 | Steinmetz et al. |

(56) References Cited

U.S. PATENT DOCUMENTS

| | | | |
|---|---|---|---|
| 2005/0151052 | A1 | 7/2005 | Jutte et al. |
| 2005/0168819 | A1 | 8/2005 | Vail et al. |
| 2005/0207466 | A1 | 9/2005 | Glebov et al. |
| 2005/0265416 | A1 | 12/2005 | Zucker et al. |
| 2006/0029120 | A1 | 2/2006 | Mooradian et al. |
| 2006/0123344 | A1 | 6/2006 | Volkov et al. |
| 2006/0156241 | A1 | 7/2006 | Psaltis et al. |
| 2006/0256827 | A1 | 11/2006 | Volodin et al. |
| 2006/0274810 | A1 | 12/2006 | Steffans et al. |
| 2008/0137698 | A1 | 6/2008 | Sorin et al. |

FOREIGN PATENT DOCUMENTS

| | | |
|---|---|---|
| JP | 04-287001 A | 10/1992 |
| JP | 04-324316 A | 11/1992 |
| JP | 09-502838 A | 3/1997 |
| SU | 178429 A1 | 11/1990 |
| WO | WO 95/08206 A1 | 2/1995 |
| WO | WO 03/036766 A3 | 5/2003 |
| WO | WO 03/045863 A1 | 6/2003 |

OTHER PUBLICATIONS

"In the United States District Court for the District of New Jersey", Ondax, Inc., Case No. 08-cv-03494, Answer to Complaint: Affirmative Defenses; Counterclaims and Jury Demand, Aug. 13, 2008, 31 Pages.
In the United States District Court for the District of New Jersey, *PD-LD, Inc.*, v. *Ondax, Inc.*, Case No. 08-cv-03494, Draft Amended Answer to Complaint Affirmative Defenses; Counterclaims and Jury Demand, Sep. 18, 2008, 34 Pgs.
In the United States District Court for the District of New Jersey, *PD-LD, Inc.*, v. *Ondax, Inc.*, Case No. 08-cv-03494, Initial Disclosures of Defendant Ondax, Inc. Pursuant to FRCP 26(a)(1), Sep. 12, 2008, 10 Pgs.
U.S. Appl. No. 08/842,645, "High Resolution Holographic Image and Data Storage System", Inventors—Koichi Sayano and F. Zhao, Apr. 15, 1997.
Application No. 820/CAL/93, "Method for Writing Reflection Mode Gratings in Photorefractive Materials in the Infrared.", Applicant calls to the Office's Attention, Application No. 820/CAL/93, Filed Dec. 28,1993, Inventors—Victor Leyva and George Rakuljic, Dec. 28, 1993.
Borgman et al., "Photothermal refractive effect in silicate glasses,", Sov. Phys. Dokl., Nov. 1989, 1011-1013.
Borrelli et al., "Photosensitive glasses and glass-ceramics,", Glass Processing, 439-444.
Breer et al., "Low-crosstalk WDM by bragg diffraction from thermally fixed reflection holograms in lithium niobate,", Electronics Letts., 1998, 34(25), 2419-2421.
Chang-Hasnain, "High power with high efficiency in a narrow single-lobed beam from a diode laser array in an external cavity,", Appl. Phys. Lett., 1987, 50(21), 1465-1467.
Churin et al., "Design of free-space WDM router based on holographic concave grating,", IEEE Photonics Techn. Letts., Feb. 1999, 11(2), 221-223.
Datta et al., "Modeling of nonideal volume Bragg reflection gratings in photosensitive glass using a perturbed transmission matrix approach,", IEEE J. of Quantum Electronics, 2004, 40(5), 580-590.
Dicing Solutions for DWDM optical filter applications; advertising brochure of ADT Advanced Dicing Technologies, Stockholm, Sweden, 2003, 2 pgs.
Dmitriyev et al., "Volume holograms in the optical devices of optical-fiber data transmission systems, A review,", Telecommun. & Radio Eng., 1995, 49(12), 9-15.
Efimov et al., "Diffractive Optical Elements in Photosensitive Inorganic Glasses", Proceedings of the SPIE Inorganic Materials III, Aug. 2, 2001, 39-47.

Efimov et al., "High-efficiency bragg gratings in photothermorefractive glass,", Applied Optics, Feb. 1, 1999,38(4),619-627.
Glebov et al., "High-efficiency volume hologram recording in silicate glass,", School of Optics and CREOL, University of Central Florida, Orlando, FL, 16 pages.
Glebov et al., "Photosensitive glass for phase hologram recording,", Glass Science and TechnolofIY, 1998, 71C, 85-90.
Glebov et al., "Polychromic glasses—a new material for recording volume phase holograms,", Sov. Phys. Dokl., Oct. 1990, 35(10), 878-880.
Goodman et al., "Introduction to fourier optics,", McGraw-Hill Co., Inc., 2nd Ed., 1996, 329-330.
Harrison et al., "Coherent Summation of Injection-Locked, Diode-Pumped Nd: YAG Ring Lasers",, Optics Letters, Feb. 1998, 13(2), 111-113.
Hendow, S., "Crystal bragg gratings stabilize laser sources,", Laser Focus World, Nov. 1996, S19-524, Nov. 1996.
Jannson et al., "Lippmann-Bragg Broadband Holographic Mirrors", J. of the Optical Soc. of Am., 1991, 8(1), 201-211.
Kogelnik et al., "Coupled wave theory for thick hologram gratings,", The Bell System Technical Journal, Nov. 1969,48(9), 2909-2947.
Kozlov et al., "All-Fiber Coherent Beam Combining of Fiber Lasers", Optic Letters, Dec. 15, 1999, 24(24), 1814-1816.
Leger et al., "Coherent Beam Addition of GaAiAs Lasers by Binary Phase Gratings", Appl. Phys. Lett., Apr. 1986, 48(14), 888-890.
Leger et al., "Coherent Laser Addition Using Binary Phase Gratings", Applied Optics, 1987, 26(20), 4391-4399.
Leger et al., "Efficient Side Lobe Suppression of Laser Diode Arrays", Appl. Phys. Lett., 1987,50(16), 1044-1046.
Liu et al., "Modeling and design of planar slanted volume holographic gratings for wavelength-division-multiplexing applications,", Applied Optics, Dec. 1, 1999, 6981-6986.
Loiseaux et al., "Characterization of Perpindicular Chirped Phase Volume Grating Pairs for Laser Stretching", Optic Letters, OSA, 1996, 21(11), 806-808.
Menard et al., "Highly Efficient Phase Locking and Extracavity Coherent Combination of Two Diode-Pumped Nd: YAG Laser Beams", Optics Letters, Dec. 15, 1996, 21(24), 1996-1998.
Mills et al., "Single-Mode Operation of 1.55 llm Semiconductor Lasers Using A Volume holographic Grating", Electronic Letters, Jul. 1985, 21(15), 648-649.
Moser et al., "Volume Bragg grating devices,", Optical Fiber Communications Conference, 2003, 2, 644-645.
Moslehi et al., "Fiber-optic wavelength-division multiplexing and demultiplexing using volume holographic gratings,", Optics Letters, Oct. 1, 1989, 1088-1090.
Qiao et al., "Dispersion-enhanced volume hologram for dense wavelength-division demultiplexer,", IEEE Photonics Technology Letts., Aug. 2000, 12(8), 1070-1072.
Rakuljic et al., "Volume holographic narrow-band optical filter,", Optical Engineering, Oct. 1997, 36(10), 459-461.
Remy, "Lehrbuch der Anorganishen Chemic Band", 1960, 1 page.
Rodgers et al., "Laser Beam Combining and Cleanup by Stimulated Brillouin Scattering in a Multimode Optical Fiber", Optics Letters, Aug. 15, 1999, 24(16), 1124-1126.
Sakamoto et al., "20 W CW monolithic AlGaAs (810nm) laser diode arrays,", Electronic Letts., 1992, 28(2), 178-180.
Sayano et al., "Holographic grating filters in optical glasses for C31 WDM networks", Accuwave Corp., sponsored by Ballistic Missile Defense Organization, May 1998, AFRL-SN-RS-TR-1998-81, Final Technical Report, 1-35, DL-l-DL-3, May 1998.
Sayano et al., "ModularWDM add/drop multiplexers," SPIE, 1997, 3234, 102-107.
Scholes, "S. R. Modem Glass Practice", 1975, 217.
Shelby, J.E, "Introduction to Glass Science and Technology", Royal Society of Chemistry, 1997, 43.
Spectrogon, "Optical Interference Filters Catalogue", 17tn Ed., Spectrogon, Taeby, Sweden, www.spectrogen.com, 3-21.
Swanson et al., "Aperture Filling of Phase-Locked Laser Arrays", Optics Letters, Apr. 1987, 12(4), 245-247.

(56) References Cited

OTHER PUBLICATIONS

Timofeev et al., "Free-space grating multi/demultiplexer and wavelength-router for densely spaced WDM networks," IEEE, Nov. 1-Nov. 5, 1997,372-373.
Veldkamp et al., "Coherent Summation of Laser Beams Using Binary Phase Gratings", Optics Letters, May 1986, 11(5), 303-306.
Volodin et al., "High-resolution compact imaging holographic Bragg grating spectrometer,", CLEO, 1998, 401-402.
Yiou et al., "Improvement ofthe spatial beam quality oflaser sources with an intracavity Bragg grating,", Optics Letts., 2003, 28(4), 242-244.
Zhao et al., "Reliable grating-based wavelength division (de)multiplexers for optical networks,", Opt. Eng., Jul. 2001,40(7), 1204-1211.
Zhao et al., "Subpicometer accuracy laser wavelength sensor using multiplexed bragg gratings,", IEEE Photonics Technology Letts., Nov. 1997, 9(11), 1493-1495.
Zhao et al., "Ultraviolet Ca K-line narrow-bandwidth imaging filters based on holographic Bragg gratings in photorefractive materials,", Opt. Eng., Oct. 1997, 36(10), 2918-2921.
U.S. Appl. No. 10/390,521, filed Jul. 3, 2003, Volodin, et al.

\* cited by examiner

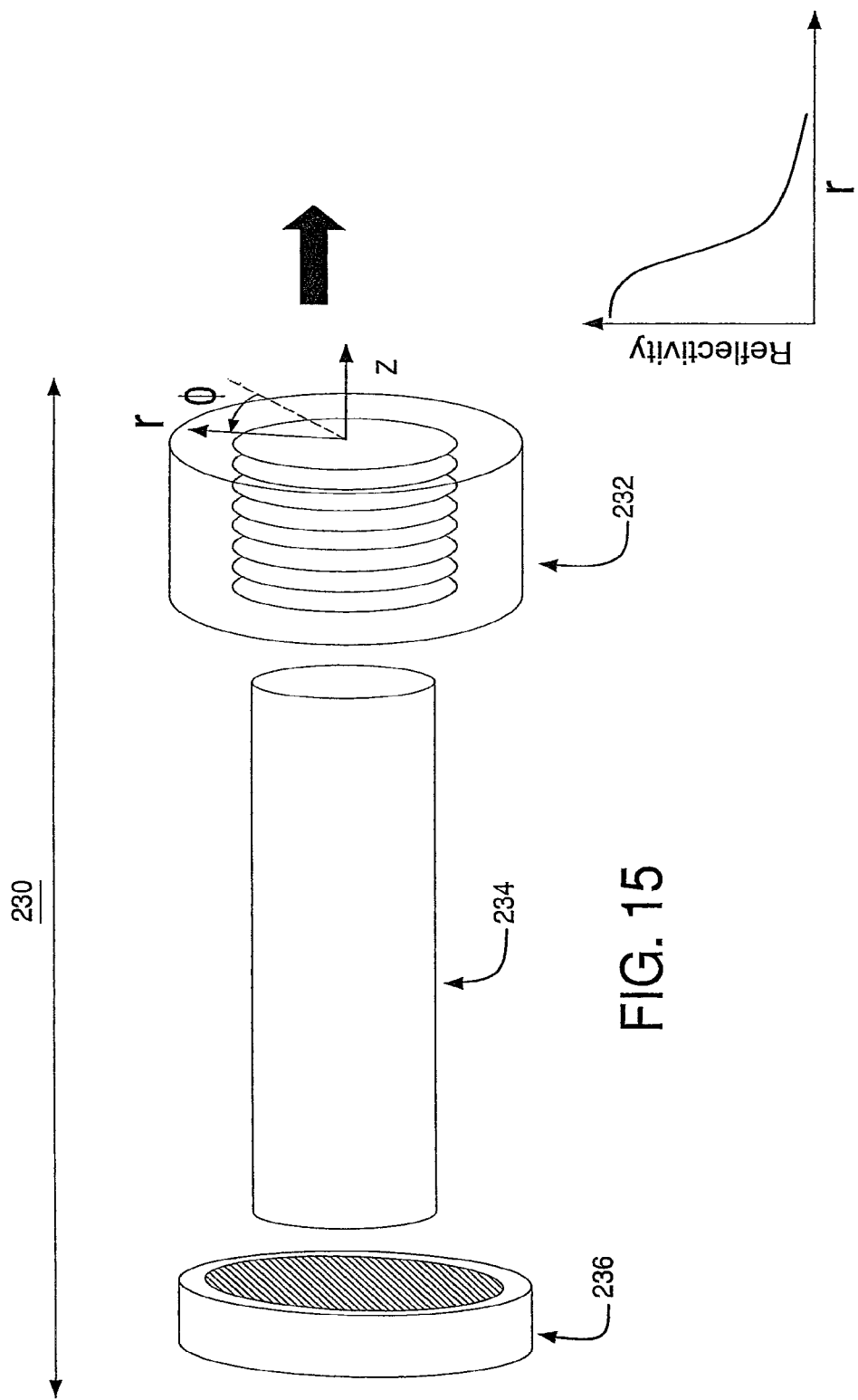

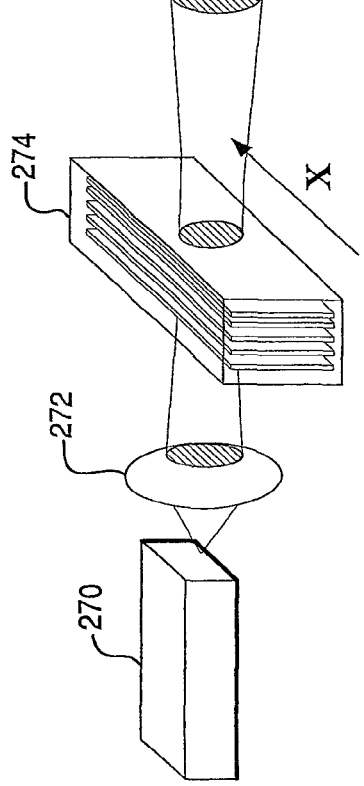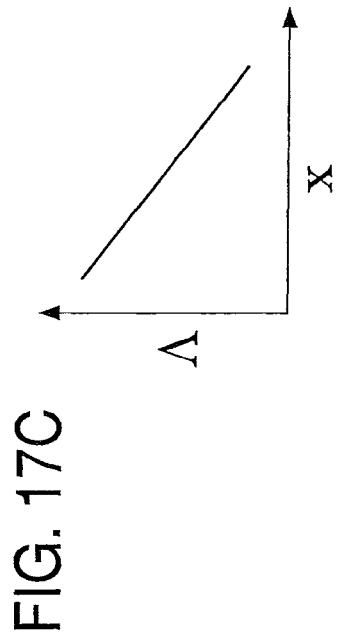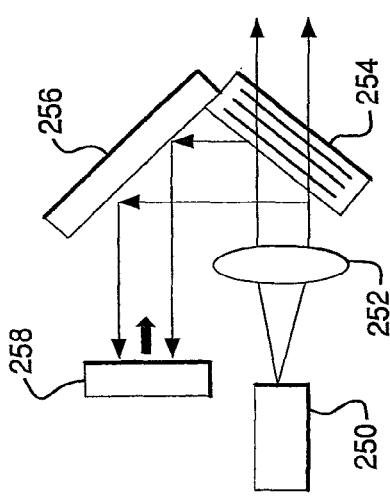
FIG. 17C
FIG. 17A
FIG. 17B

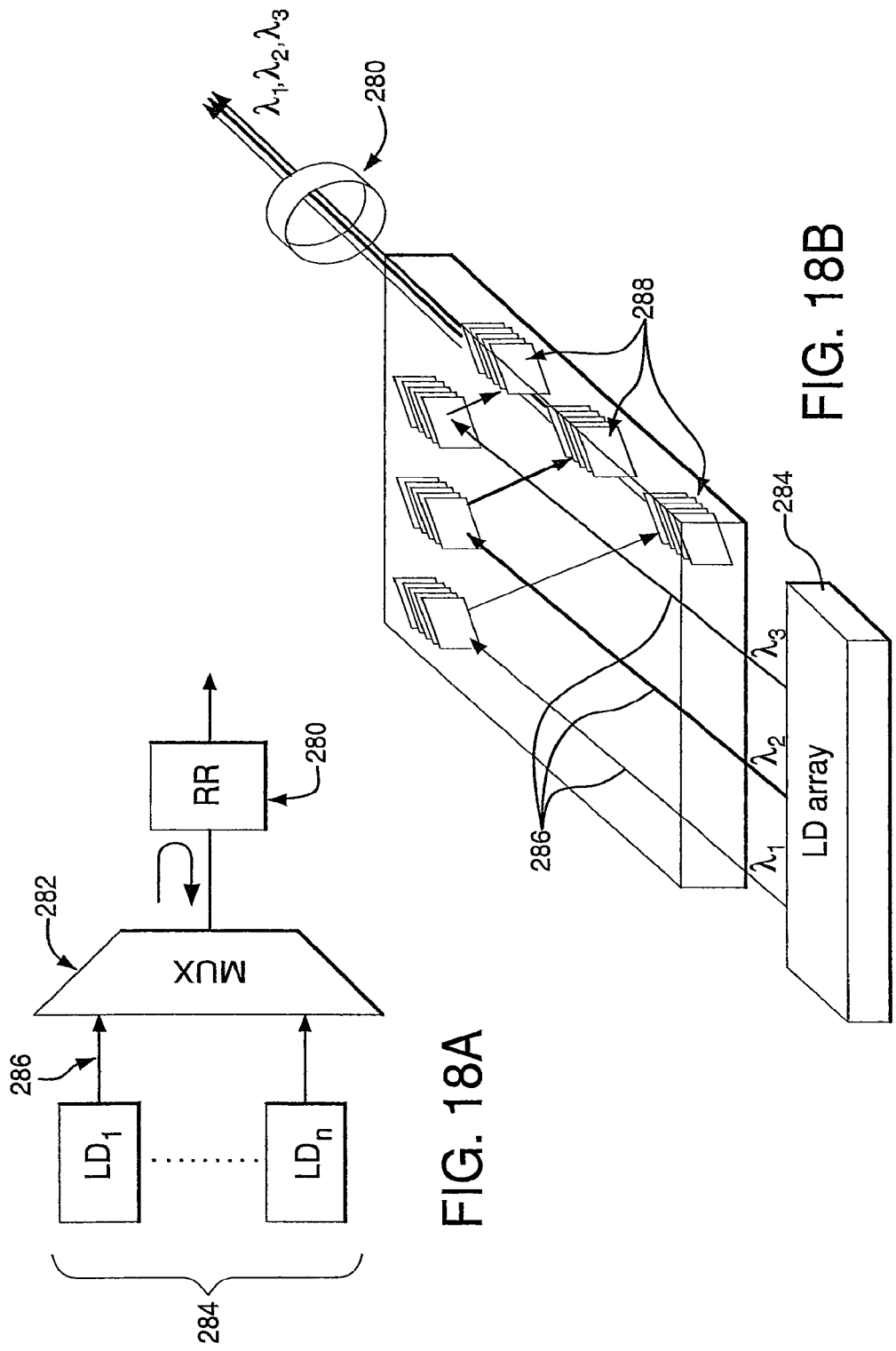

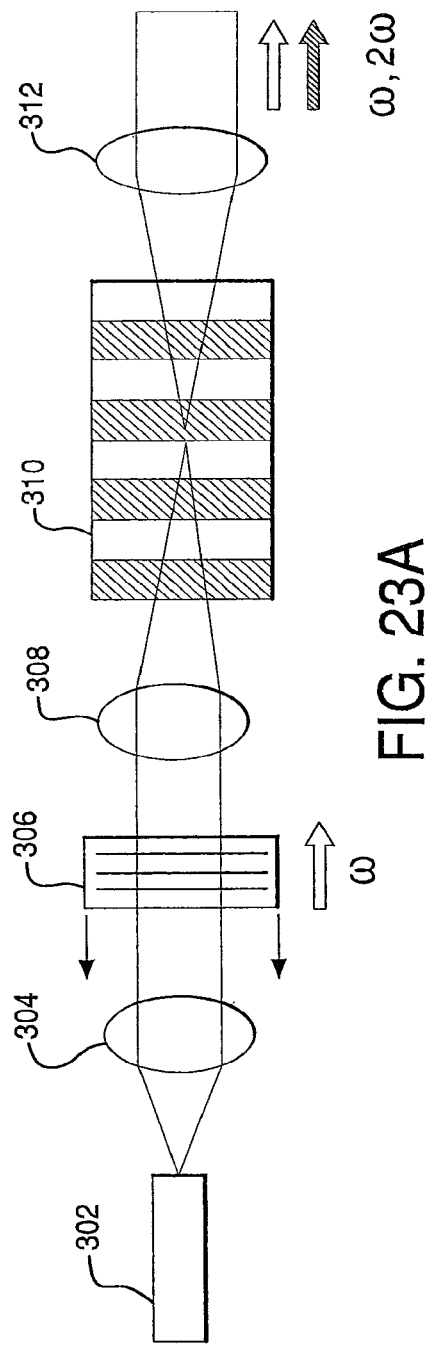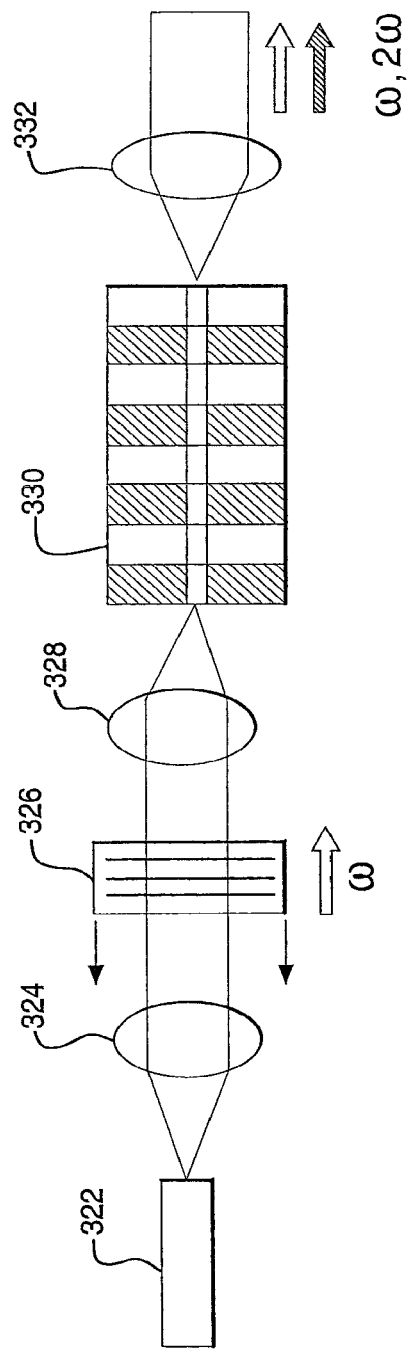
FIG. 23A
FIG. 23B

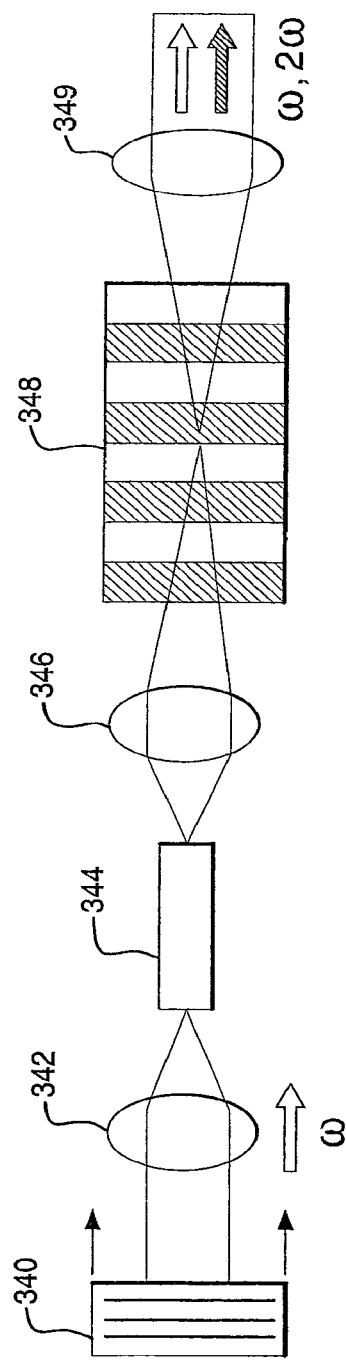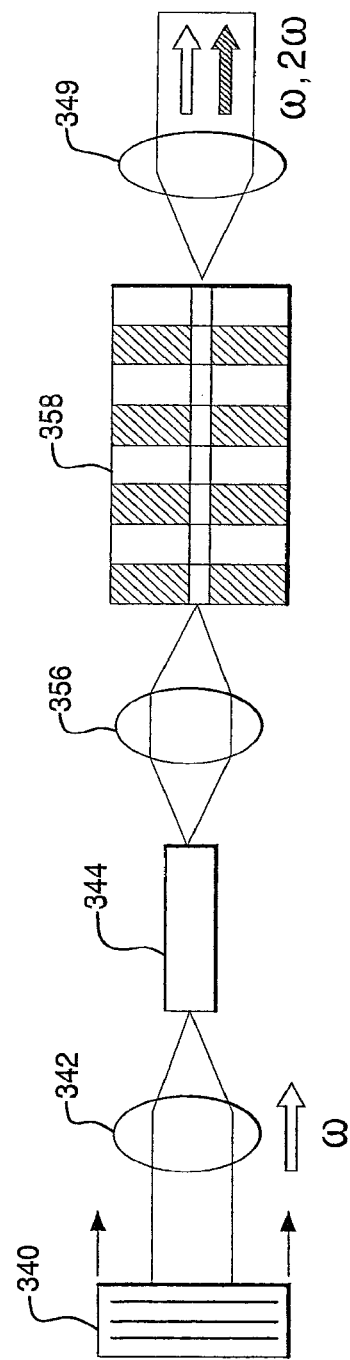

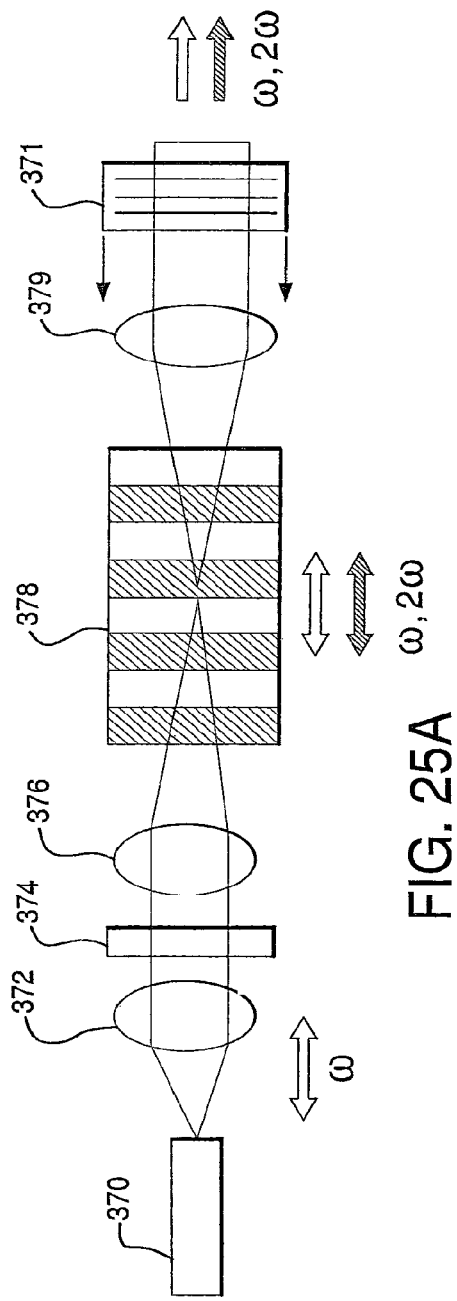
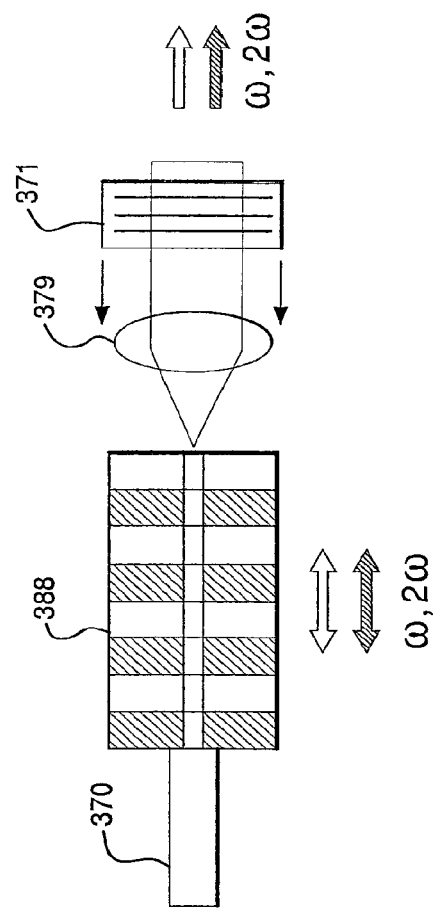
FIG. 25A
FIG. 25B

CHIRPED BRAGG GRATING ELEMENTS

CROSS-REFERENCE TO RELATED APPLICATIONS

This application is a division of U.S. patent application Ser. No. 11/407,795, filed Apr. 19, 2006, which is a continuation of U.S. patent application Ser. No. 10/884,524, filed Jul. 2, 2004, which claims benefit under 35 U.S.C. §119(e) of provisional U.S. patent applications nos. 60/484,857, filed Jul. 3, 2003, and 60/564,526, filed Apr. 22, 2004. The respective disclosures of each of the above-referenced patent applications are incorporated herein by reference.

The subject matter disclosed and claimed herein is related to the subject matter disclosed and claimed in U.S. patent application Ser. No. 11/481,475, filed Jul. 6, 2006, now U.S. Pat. No. 7,590,162, the disclosure of which is hereby incorporated herein by reference.

FIELD OF THE INVENTION

The invention is related generally to light emitting devices, such as lasers, laser diodes, light-emitting diodes, super-luminescent laser diodes, etc. More specifically, the invention provides for using one or more volume Bragg grating (VBG) elements for modifying (or conditioning) one or more output characteristics of such devices.

BACKGROUND OF THE INVENTION

Laser cavities or resonators, however complex, typically include two or more mirrors or other reflecting devices that form a closed optical path for rays traveling in a certain direction. An optical element positioned in that closed optical path, which includes mirrors and/or other reflecting devices that form the path, may be referred to as "intra-cavity." An optical element positioned in the path of light that has departed from the resonator may be referred to as an "extra-cavity" element.

Using extra-cavity partial reflectors as feedback elements with a solitary laser cavity has been attempted in the past with a purpose of achieving single longitudinal mode operation of the otherwise multi-mode laser. Such reflectors, however, were not wavelength-selective devices. Such designs may be referred to as the "coupled-cavity" approach. This approach suffered from instabilities stemming from the non-selective nature of the feedback.

Another approach used was to employ a dispersive element, such as surface diffraction grating, as an extra- or intra-cavity wavelength-selective device in order to induce narrow-band or single longitudinal mode operation of a semiconductor laser. Although successful in a laboratory, this approach results in rather bulky devices, which are difficult to align and to maintain in the field.

A somewhat more practical approach for inducing narrowband operation of a single-transverse mode semiconductor laser proved to be a fiber Bragg grating functioning typically as an extra-cavity element. This device is a narrow-band reflector that functions only in an optical fiber waveguide. It is, therefore, inapplicable to solid-state lasers, laser diode arrays, and, most likely, even to multi-mode (transverse) broad-area high-power single-emitter laser diodes, whether fiber-coupled or not.

The use of a volume Bragg grating element has been suggested as an intra-cavity element to induce single-longitudinal mode (also called single-frequency) operation of a single-transverse mode laser diode. In this approach, the volume Bragg grating element forms the external Bragg mirror of an external-cavity single-spatial mode semiconductor laser diode. However, to the inventors' knowledge, neither the possibility of using a VBG element for extra-cavity narrow-band feedback nor a practical device for achieving narrow-band operation of a single-transverse mode semiconductor laser diodes have been disclosed previously. Furthermore, to the inventors' knowledge, not even the possibility of applying VBG elements to multiple-transverse mode, broad-area laser diodes, laser diode arrays or the possibility of conditioning other attributes of laser emission (such as its spatial mode and temporal profile) have been disclosed previously.

To the inventors' knowledge, there are currently no devices in the market that employ volume Bragg grating elements for conditioning of laser characteristics, nor are there any successful practical devices in the market that use any of the above-mentioned approaches to improve the output characteristics of arrays of lasers.

SUMMARY OF THE INVENTION

The invention provides methods and apparatuses that can overcome the problems known in the prior art. The invention provides several practical embodiments of using VBG elements for conditioning any or all of the output characteristics of lasers and other light-emitting devices.

The inventors have found that volume Bragg grating (VBG) elements recorded in photorefractive materials, particularly those recorded in inorganic photorefractive glasses (PRGs), have many properties that can improve one or more characteristics of light-emitting devices such as solid-state lasers, semiconductor laser diodes, gas and ion lasers, and the like. A volume Bragg grating ("VBG") element may be any structure that: a) has a periodically varying index of refraction in its bulk (the shape of the surface of the constant index of refraction can be any smooth figure, flat or curved); b) is generally transparent in the spectral region of its operation; and c) has a thickness in the direction of propagation of light of 0.05 mm or more.

A photorefractive material may include any material that has the ability to change its index of refraction subsequent to illumination by light of certain wavelength region or regions. Such a change in refractive index may occur in the material either immediately upon illumination by light or as a result of secondary processing step or steps, whether chemical, thermal, etc. Such a material may also be generally transparent in the spectral region of its photosensitivity, i.e. the light at the recording wavelength may have the ability to penetrate sufficiently deep into the material (>0.1 mm) without suffering excessive absorption (>90%). Further, the material may be amorphous and generally isotropic.

Though the embodiments described herein are directed to certain examples of laser devices, it should be understood that the principles of the invention apply to other light-emitting devices as well. For example, applications of this invention include but are not limited to: high-power, semiconductor, solid state, ion, and gas lasers; light-emitting diodes and super-luminescent laser diodes; medical diagnostics, treatment, and surgical instruments; environmental sensors; metrology instruments; industrial applications; and defense applications.

Properties of VBG elements, and methods for manufacturing VBG elements, have been described previously (see, for example, U.S. patent application Ser. No. 10/390,521, filed Mar. 17, 2003).

Generally, there are at least three distinct characteristics of the output of a laser device that may be improved using the techniques of the invention: 1) emission spectrum (e.g., peak wavelength of the laser emission and its spectral width); 2) spatial/angular beam characteristics (e.g., the angular divergence of the output laser beam and its spatial mode structure); and 3) temporal profile of the laser pulses (e.g., the duration of the laser pulse, its temporal phase variation or chirp etc.). As used herein, spectral, spatial, or temporal conditioning, refer to affecting any of the above characteristics, respectively.

The inventors have found that VBG elements permanently recorded in a suitable material, particularly a PRG, have a number of properties that can be utilized for improving one or more of the above characteristics. These properties include, but are not limited to: 1) single spectral pass band without any extraneous pass bands; 2) ability to control the spectral width of the VBG filter pass band; 3) ability to control the amplitude and phase envelope of a VBG filter; 4) narrow acceptance angle range otherwise called field of view; 5) ability to control the acceptance angle and the field of view; 6) ability to multiplex more than one filter in the same volume of the material; 7) high damage threshold of the VBG elements manufactured in a suitable material, particularly PRG; 8) ability to be shaped into bulk optical elements with sufficiently large clear aperture; and 9) reflectivity distributed over the volume of the material.

The invention provides apparatus and methods by which these properties of VBGs may be applied to the improvement of the above-mentioned laser characteristics.

BRIEF DESCRIPTION OF THE DRAWINGS

FIG. 15 depicts simultaneous single longitudinal mode and $TEM_{00}$ mode selection by use of VBG element with smoothly varying reflectivity profile.

FIGS. 17A-17C depict how a VBG may be used to construct tunable devices.

FIGS. 18A and 18B depict simultaneous spectral and spatial conditioning, and combining of the output of an array of emitters by use of an external feedback filtered through a wavelength multiplexing device.

FIGS. 23A and 23B depict an embodiment for extra-cavity doubling of a high-power laser diode frequency.

FIGS. 24A-24C depict another embodiment for extra-cavity doubling of a high-power laser diode frequency.

FIGS. 25A and 25B depict intra-cavity doubling of a high-power laser diode frequency.

DETAILED DESCRIPTION OF ILLUSTRATIVE EMBODIMENTS

Overview

Figure 1A:
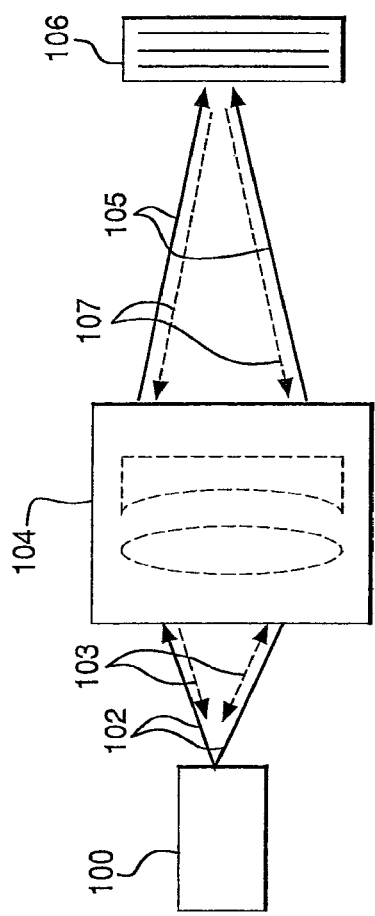
FIGS. 1A-1C depict a VBG as an extra-cavity element for wavelength locking by self-seeding.

There are at least two general approaches to using VBG elements for conditioning a characteristic of a light emitting device: a) using a VBG that is outside of the laser cavity (extra-cavity); and b) using a VBG that is inside laser cavity (intra-cavity).

As discussed above, a laser resonator may be viewed as a closed optical path formed between mirrors and/or other light-reflecting elements. Such a closed optical path is typically a condition that is necessary for lasing to occur. For this reason, it is desirable that any intra-cavity element added to the resonator does not alter this condition, lest it impede light generation via stimulated emission. By contrast to intra-cavity elements, extra-cavity elements may be free from such a constraint. Furthermore, the efficiency of light generation typically depends nonlinearly on single-pass cavity loss. Thus, it is also desirable that any intra-cavity element used for laser output conditioning have as little loss as possible. This includes the losses in the element itself, as well as the losses in the optical delivery system used to project light onto the element and back. In contrast, extra-cavity elements used for laser output conditioning may be much more tolerant to the loss factor.

When used for narrowing the spectral output of a laser, intra-cavity elements provide wavelength-selective loss that raises the lasing threshold for all but a few cavity modes. In contrast, the feedback from an extra-cavity wavelength-selective element reduces lasing threshold for just a few cavity modes, which creates preferred lasing conditions for those modes. These modes, then, consume most or all of the available laser gain and prevent other modes from lasing. Similar processes affect the formation of the spatial mode of the laser when intra- and extra-cavity elements are used for spatial mode conditioning.

An optical delivery system may be viewed as a collection of optical elements, e.g. lenses, mirrors, prisms etc., that collects some or all of the light emanating from a particular aperture of the laser cavity, projects some or all of this light onto a VBG element or a system thereof, and then collects some or all of the light returned from said VBG element and projects it back onto the aperture of laser cavity.

When considering the intra-cavity use of VBG elements, a design factor that may be considered is the reduction of the total loss of the VBG element plus the optical delivery system for the preferred longitudinal and transverse modes of the laser. In comparison, the design of an extra-cavity system for laser output conditioning may be more complex. In order to achieve stable output with desired characteristics, it may be desirable to optimize any or all of the following factors: 1) The solitary cavity design, including, but not limited to, cavity length, reflectivity of the cavity mirrors, threshold, differential efficiency, etc., all of which may be dependent on the properties of the gain medium; 2) The intrinsic reflectivity and loss of the VBG element; 3) The spectral bandwidth of the VBG element; 4) The reflectivity of the VBG element facets; 5) The relative angle between the volume Bragg grating planes and the external facets of the element; 6) The design of the external optical delivery system projecting light onto and back from the VBG element, including, but not limited to, its total coupling efficiency into the solitary laser cavity, the length of the external cavity, the divergence of the light (in both directions) incident upon the VBG and the output coupler of the solitary cavity, etc.

For example, single-transverse mode laser diodes that are stabilized by a fiber Bragg grating may have such a fiber Bragg grating positioned rather far from the laser diode chip (typically about 1 meter) in order to induce the so-called coherence collapse regime of operation. Such a condition may be necessary to achieve stable laser output. However, if a VBG element was used as a mere free-space replacement of the fiber Bragg grating, it may result in a device 1.5 m long without an advantage of easy coiling or folding that the optical fiber affords naturally. Such a device might not be practical, however, and, therefore, different stable operating conditions might be desirable for devices using VBG elements for laser output conditioning, which are the result of the optimization of the above-described parameters.

Extra-Cavity Use of VBG Elements

A VBG element may be used extra-cavity to condition, spectrally, spatially, and/or temporally, light received from a light-emitting device. At least a portion of the conditioned light may then be fed back into the laser cavity. In the process of doing so, the light emitted from the laser will assume the characteristics of the light conditioned by the VBG. Example embodiments of such extra-cavity use of VBG elements are depicted in FIGS. 1-9. Note that, when the VBG is used in extra-cavity configuration, the laser device is operating above threshold in the absence of optical feedback from the VBG element.

In an example embodiment, a VBG element and a laser output coupler may be positioned in conjugate planes. An optical system including one or more lenses may be positioned in the light path after the light exits the laser cavity through the output coupler. Such an optical system may form an image of the output coupler in a particular location in space outside the laser cavity. A VBG element may be positioned in that plane so that the VBG element reflects the light rays incident upon it in such fashion that the reflected rays go back through the imaging optical system and form an image in the plane of the output coupler. In this case, it may be said that the output coupler and the VBG are positioned in the conjugate planes of the imaging optical system. A feature of this configuration is that it maximizes the coupling efficiency from the external element (the VBG element in this case) back into the laser cavity, essentially matching the resonator mode pattern in both transverse directions. Such an embodiment may be desirable where the laser cavity is a waveguide, such as in the case of semiconductor laser diodes, for example.

In another example embodiment, the output of a waveguide laser cavity (e.g., a semiconductor laser diode) may be approximately collimated in one axis (e.g., the fast axis) by a cylindrical lens. The other axis (e.g., the slow axis) of the laser output may be allowed to diverge freely. The VBG element may be positioned in the optical path of the laser output behind the cylindrical lens and aligned in such a way that it reflects portion of the laser light back into the laser cavity. In this embodiment the coupling efficiency of the optical delivery system (e.g., the cylindrical lens) from the VBG back into the laser cavity is very low, making it undesirable for use as an intra-cavity element. However, such a system may be designed to operate stably in an extra-cavity configuration. It will induce wavelength-stable, spectrally narrowed operation of the laser diode. In this configuration the divergence of the non-collimated laser axis (the slow axis) can also be reduced without the use of additional optics, when such a laser is a broad-area multiple transverse mode semiconductor laser diode. In this configuration an entire linear array of semiconductor lasers can be conditioned with a single cylindrical lens and a single VBG element.

An example embodiment of a broad-area high-power semiconductor laser, having an emitting aperture of greater than about 50 µm, with output conditioned by an extra-cavity VBG with a cylindrical fast-axis lens, is also disclosed. The output power of the laser changes rather insignificantly despite the fact that the VBG reflectivity is relatively high (30%). Small reduction in the output power is a factor in the design of practical systems using high-power laser diodes and may be provided by the invention.

Example design parameters for stable operation of broad-area semiconductor laser diodes may include: laser cavity, 1-3 mm long; emitting aperture, 100-500 µm; back facet reflectivity, 0.9 or greater; front facet reflectivity, 0.5-20%; FAC lens EFL, 50-2000 µm; FAC lens type, graded-index cylindrical or plano-convex aspheric cylindrical; FAC AR coating, all facets <2%; VBG reflectivity, 5-60%; VBG thickness, 0.2-3 mm; VBG position behind FAC lens, 0-10 mm; and angle of the VBG planes with respect to its facet, 0-5 degrees.

An example embodiment of an extra-cavity VBG without any optical delivery system (e.g., without any lenses) is also disclosed. In this embodiment a VBG element may be positioned in the optical path of the light behind the output coupler (e.g., the laser diode front facet) without any extra optical elements (e.g., lenses) in between. In the case of a waveguide cavity, such as the case for semiconductor laser diodes, only a very small portion of the total laser output power may be returned by the VBG into the laser cavity. However, with proper laser cavity and VBG design, it is possible to achieve spectral narrowing and stabilization of the output wavelength across a range of operating conditions.

Example design parameters for such an embodiment may include: laser cavity, 1-3 mm long; emitting aperture, 100-500 µm; back facet reflectivity, 0.9 or greater; front facet reflectivity, 0.2-5%; VBG reflectivity, 30-99%; VBG thickness, 0.05-3 mm; VBG position in front of the laser, 0-5 mm; and angle of the VBG planes with respect to its facet, 0-5 degrees.

Some of the embodiments described herein demonstrate how the output of a laser diode, laser diode bar, or stack may be modified spectrally and/or spatially. Effects of the VBG element in these cases include spectral narrowing of the emission line of a laser or laser array, stabilization of the peak emission wavelength of a laser or a laser array, and the reduction of the divergence of the slow axis of a laser or a laser array.

Note that the high total output power of the laser transmitting through the clear aperture of the VBG (>20 W for laser diode arrays), the high power density on the VBG element (>40 W/cm$^2$) as well as high temperature excursions suffered by such an element (T>100 C) may limit the choice of suitable materials for VBG implementation. Nevertheless, the inventors have successfully demonstrated VBG elements operation in all of the above conditions when implemented in PRG materials.

Figure 8:
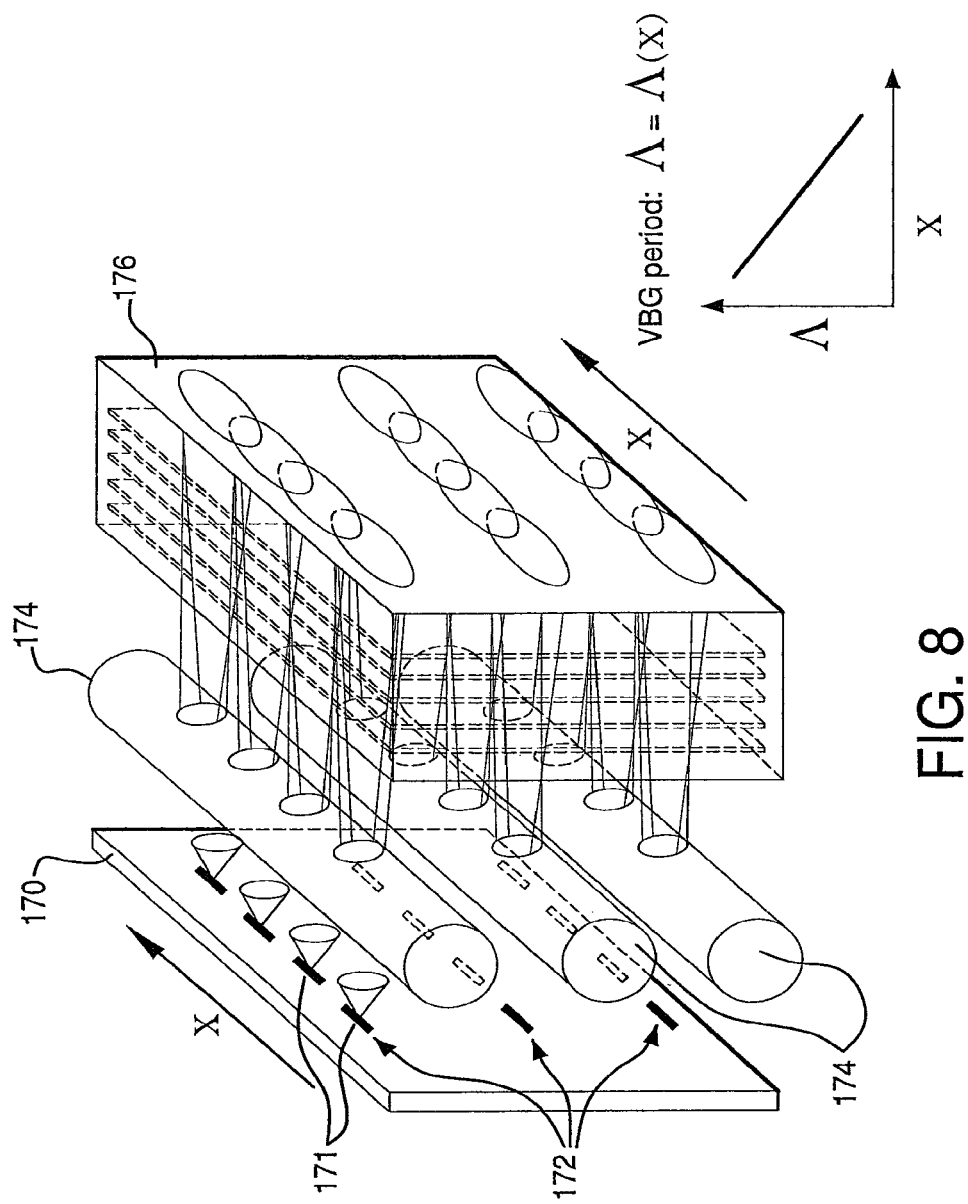
FIG. 8 depicts a wavelength-shifted laser diode bar/stack.

FIG. 8, for example, demonstrates how both of these properties may be utilized in order to combine the output of an entire array of lasers onto a single target using a single VBG. In that embodiment, the VBG element contains a grating having a period that varies depending on location. When positioned properly in front of an array of emitters, such a grating will force different emitters to operate at a different peak wavelength depending on their location, creating a wavelength-shifted laser array. The output of such an array may be subsequently combined by use of one of a number of well-known wavelength multiplexing techniques into a much brighter spot with intensity essentially equivalent to that of the entire array and spatial dimensions essentially equivalent to that of an individual emitter.

An embodiment for spectral power combining of a laser diode array via external feedback through a wavelength multiplexer is also disclosed. In this embodiment, a wavelength multiplexer may be positioned in the path of output light of an array of emitters and behind an optical delivery system. Such a multiplexer may be designed to combine the output of all the emitters into one beam, provided they operate at the wavelengths matching the appropriate input channels of the multiplexer. Such a condition may be achieved automatically when an external feedback is provided into the emitters from a partial reflector positioned in the light path behind the wavelength multiplexer. In this configuration, the reflected light will travel back through the multiplexer and separate into multiple channels different in wavelength. As a result, each of the emitters in the array will receive feedback at a wavelength matching that of the corresponding channel of the multiplexer. Such feedback will force each emitter to operate at appropriate wavelength, so that their output power is efficiently combined.

Other applications include, but are not limited to, stabilization of super-luminescent laser diodes, light-emitting diodes, solid-state lasers, gas and ion lasers; wavelength stabilization of sources used in telecommunications, sensing, metrology, material processing, other industrial applications and defense electronics; multi-wavelength emitters and emitter arrays for use in any of the application areas mentioned above; and tunable-wavelength emitters.

Intra-Cavity Use of VBG Elements

VBG elements may be used inside a laser cavity, rather than through an external feedback, to affect laser output directly. Examples of embodiments of intra-cavity use of VBG elements are provided in FIGS. 10-16.

A VBG may be used to force a laser to operate on a single longitudinal mode. Due to the highly selective reflectivity of a VBG reflector, only one longitudinal mode of the laser cavity has gain exceeding the lasing threshold. Conventionally, monolithic or air-spaced etalons are used to select a single longitudinal mode of a solid-state laser (e.g., Nd:YAG). Very often, additional elements (e.g., thin etalon or a birefringent filter or both) are employed in order to achieve single-frequency operation, even for a narrow gain-bandwidth medium. It may be desirable that these elements, which provide wavelength-selective loss inside the cavity, are tuned in synch with each other and with the length of the main cavity in order to provide continuous, hop-free tuning.

There are numerous ways to achieve single longitudinal mode (or single frequency) operation, with some of the embodiments described below. In one embodiment, a reflective VBG element may be used as the output coupler or the high reflector of a laser resonator. The length of the VBG element may be selected in such a way that its reflectivity drops rapidly when the wavelength is detuned from the Bragg condition. Consequently, only one resonator mode reaches lasing threshold.

In another embodiment, two VBG elements may be employed—one as the high reflector and one as an output coupler of the laser resonator. The VBG elements may have slightly shifted peak reflectivity wavelengths, which creates more rapid change in cavity loss with wavelength. This would allow the use of shorter, less selective VBG elements and/or longer laser resonators.

In yet another embodiment, the VBG may act as a distributed feedback (DFB) element, taking place of both resonator mirrors. Such an element may be monolithic, with proper phase shift between the two halves of the Bragg grating. In this embodiment, the active medium may be the VBG itself, which can be achieved with proper doping with active ions, or the active medium can be attached to the VBG element along the length of the Bragg grating, partially or entirely.

It may be desirable that a laser output include only one (e.g., the lowest) spatial mode, which in free-space resonators has the designation TEM$_{00}$. This mode has a smooth intensity profile and the lowest possible angular divergence. However, such TEM$_{00}$ operation is often rather difficult to achieve in high-power lasers with high single-pass gain. The techniques for achieving TEM$_{00}$ operation usually rely on the differences in the spatial and angular profile of the TEM$_{00}$ and the higher modes by introducing an element or elements with position-dependent loss (apertures) or angle-dependent loss. VBGs are well suited to serve in either capacity.

Glebov, et al., have disclosed an approach for using a transmission-type VBG element inside a solid-state laser cavity to provide an angle-dependent cavity loss. However, that approach uses a VBG as an intra-cavity folding element that has very high angular sensitivity and requires very delicate and extremely accurate alignment. If the alignment of such a folding element is disturbed, the laser generation will seize, which makes this approach undesirable. A preferred approach would be to use a mode-forming element that by itself does not require critical alignment and, when perturbed, would not stop laser operation, but rather allow higher spatial modes to achieve lasing threshold, at most. This requires an element or elements that have low loss for TEM$_{00}$ mode, have high loss for all higher modes, and do not alter the optical path of the TEM$_{00}$ mode. This class of intra-cavity mode-forming elements may be referred to as "non-folding" mode-forming or mode-stripping elements.

It should be understood that the diffraction efficiency of a VBG element depends on the angle of incidence for a given wavelength of light. For this reason, it will produce an angle-dependent gain/loss profile in the laser cavity. Such a gain profile will create higher losses for spatial modes higher than TEM$_{00}$ and, therefore, can be used for suppressing higher spatial mode in the laser resonator ("mode-stripping"), resulting in a clean $TEM_{00}$ output of the laser.

Figure 12:
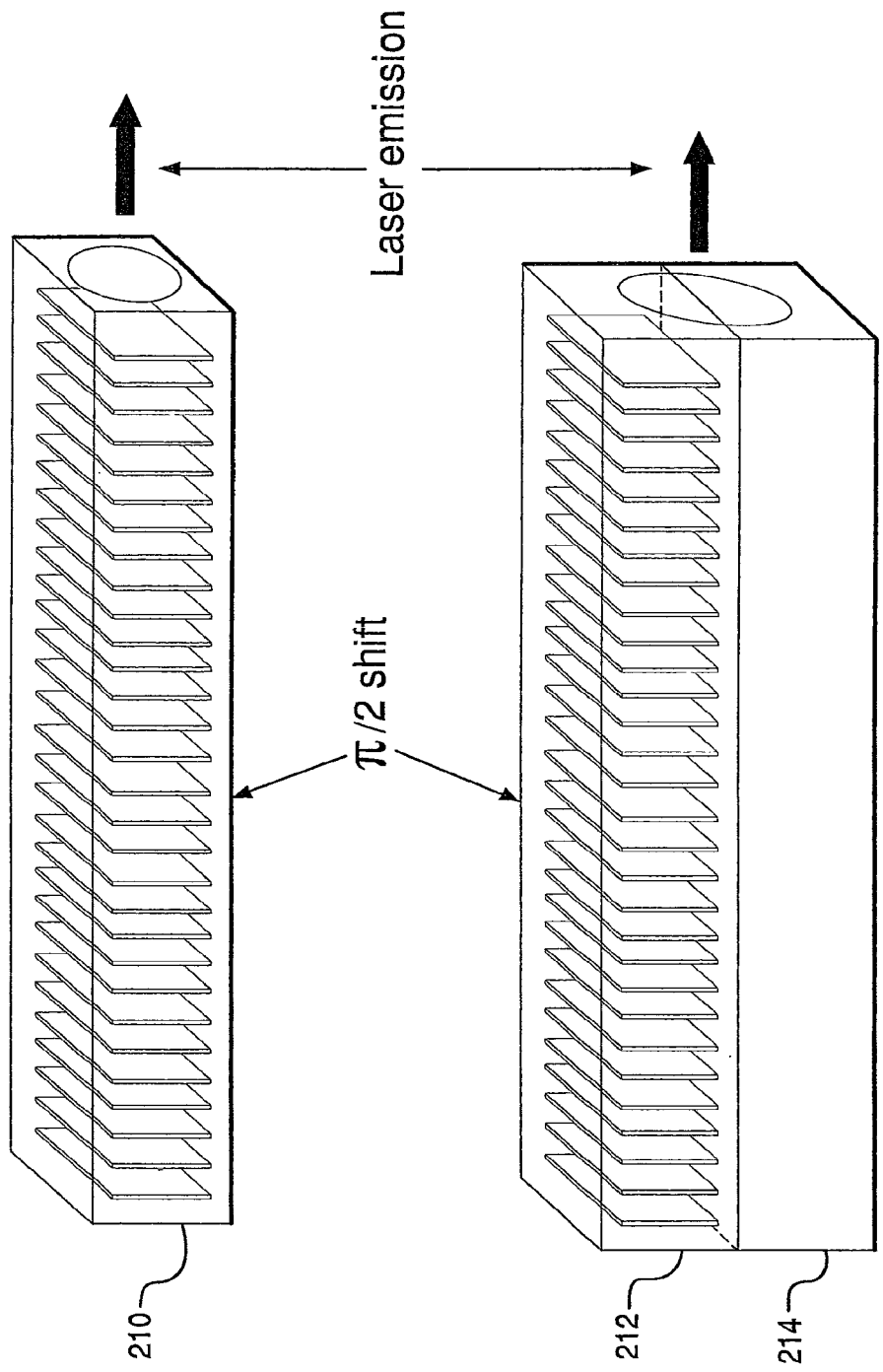
FIGS. 12A and 12B depict using a VBG element for selection of a single longitudinal mode of a laser in distributed feedback configurations.

To function as a spatial mode-stripping device, a VBG element may have a variety of angular diffraction efficiency profiles, such as those provided and described below in connection with FIG. 12. It should be understood that other possible types of angular profiles of diffraction efficiency of a VBG element may lead to the desired effects on the output of a laser. It should also be understood that reflection and transmission type VBG elements, as well as hybrid elements, may be utilized to achieve the desired effect. The principles of the invention may be applied to any or all of these cases without limitation.

An example embodiment of a non-folding mode-forming element is a VBG mirror with a Gaussian or super-Gaussian reflectivity profile. In this embodiment, a reflective VBG element may have an axially-symmetric reflectivity profile with smooth radial variation of the reflectivity following, preferably, a super-Gaussian shape. Such an element, when used either as an output coupler or the high reflector of the laser cavity, may be designed to overlap spatially with the $TEM_{00}$ mode at that particular location within the resonator, but it would have high losses for all the higher resonator modes. Such a VBG element with a soft aperture may have either plane parallel Bragg planes (e.g., a zero optical power VBG element) or have Bragg planes designed to have a particular curvature (e.g., a VBG element with finite optical power).

Another embodiment includes the use of a transmissive, non-folding VBG element to diffract higher resonator modes away from the resonator optical axis. This approach relies on the high angular selectivity of the transmissive VBGs and may be made with such angular reflectivity profile that the $TEM_{00}$ mode is transmitted through such an element without being diffracted, that is, with little or no loss. Several or all of the higher modes, starting with $TEM_{01}/TEM_{10}$, may experience sufficient diffraction, and, therefore, loss, such that they do not reach the threshold for lasing. Such a VBG element may or may not have axial symmetry in its angular profile of the diffraction efficiency.

Yet another example embodiment is based on the natural angular selectivity of a reflective VBG. Such a VBG element, serving as the output coupler or the high reflector of the laser cavity, would have high reflectivity for the incident waves of a particular wavelength near the normal to the grating planes, but the reflectivity would drop rapidly for the waves incident upon such VBG element at an angle outside its angular acceptance. Therefore, the VBG element would satisfy the three criteria for non-folding mode-forming elements outlined above.

The amplitude and phase envelope of the VBG may be adjusted in order to produce a desired effect on the temporal profile of ultra-short laser pulses. One particular example is the compensation of pulse chirping produced inside the laser cavity by other elements, such as the laser gain medium.

DETAILED DESCRIPTIONS OF EXAMPLE EMBODIMENTS DEPICTED IN THE FIGURES

Figure 1B:
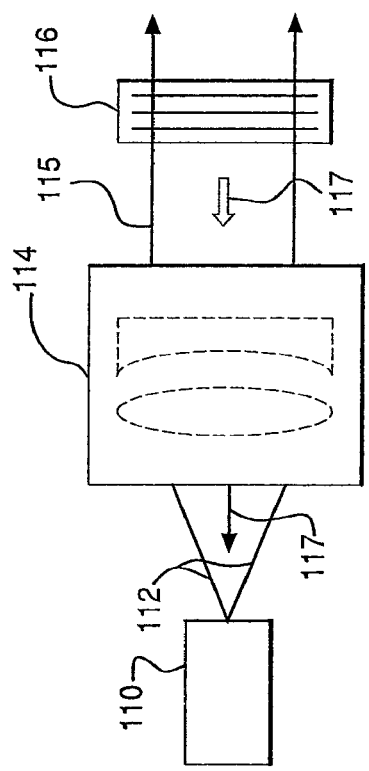
Figure 1D:
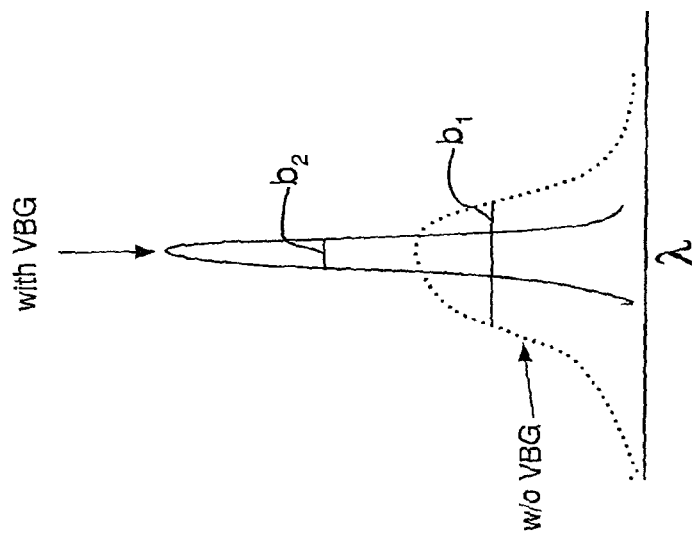
FIG. 1D provides plots of wavelength characteristics with and without laser conditioning.
Figure 1C:
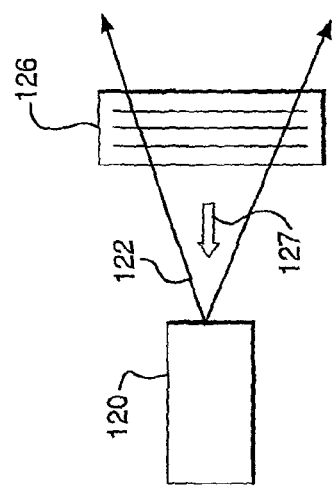

FIGS. 1A-C illustrate applications of a VBG as an extra-cavity element for wavelength locking via self-seeding, that is, where the VBG element provides wavelength-selective feedback into the laser cavity. FIG. 1A shows wavelength locking and narrowing by use of an optical delivery system 104. Laser radiation 102 is emitted from the emitting aperture of a laser 100. The optical delivery system 104 redirects the emitted radiation 102, as a redirected emission 105, onto a VBG element 106. Radiation 107 is reflected by the VBG element 106. The optical delivery system 104 redirects the reflected radiation 107, as redirected reflected radiation 103, back onto the emitting aperture of the laser 100. The redirected reflected radiation 103 acts as a narrow-wavelength seed, forcing the laser 100 to operate at the wavelength of the VBG 106 and also narrowing its emission spectrum.

As shown in FIG. 1B, laser radiation 112 is emitted from the emitting aperture of a laser 110. An optical delivery system 114 collimates the emitted radiation 102, as collimated radiation 115, onto a VBG element 116. The VBG element 116, having a narrow-wavelength reflectance, reflects at least a portion 117 of the laser energy back through the optical delivery system 114 and into the laser cavity of the laser 110. The reflected radiation 117 acts as a narrow-wavelength seed, forcing the laser 110 to operate at the wavelength of the VBG 116 and also narrowing its emission spectrum.

FIG. 1C shows wavelength locking by a VBG element without an optical delivery system. As shown, laser radiation 122 is emitted from the emitting aperture of a laser 120 and is incident onto a VBG element 126. The VBG element 126, having a narrow-wavelength reflectance, reflects at least a portion 127 of the laser energy back into the laser cavity of the laser 120. The reflected radiation 127 acts as a narrow-wavelength seed, forcing the laser 120 to operate at the wavelength of the VBG 126 and also narrowing its emission spectrum.

FIG. 1D provides plots of wavelength characteristics with and without laser conditioning. As shown, the conditioned radiation (e.g., radiation 103, 117, 127) has a bandwidth, $b_2$, that is much more narrow than the bandwidth, $b_1$, of the unconditioned radiation (e.g., radiation 102, 112, 122). Also, the peak intensity $I_2$ of the conditioned radiation is greater than the peak intensity $I_1$ of the unconditioned radiation.

Figure 2A:
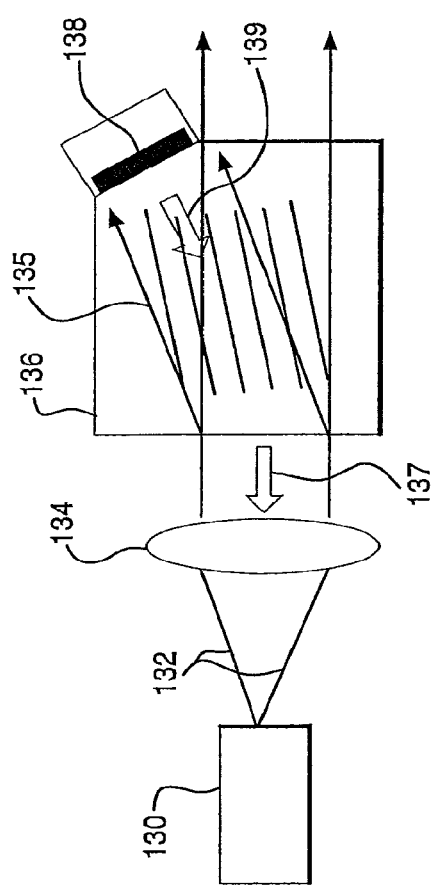
FIGS. 2A and 2B depict wavelength locking by use of a transmission VBG.
Figure 2B:
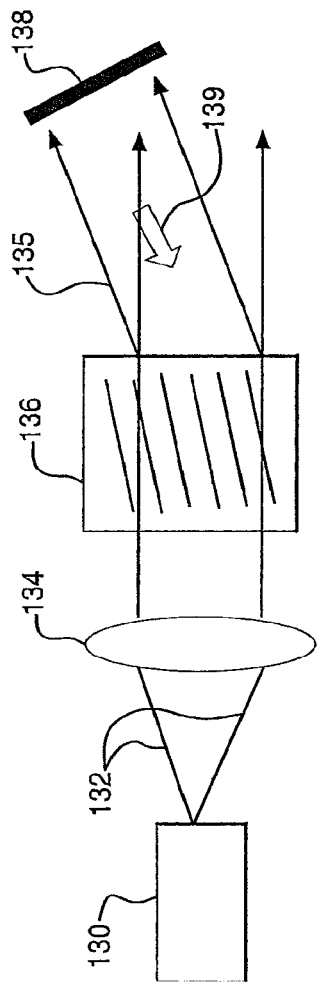

FIGS. 2A and 2B illustrate wavelength locking using an extra-cavity transmission VBG. The light 132 emitted by a laser 130 may be collimated by a lens 134 and is incident upon a VBG 136. The portion 135 of the light 132 having a wavelength within the passband of the VBG 136 is diffracted by the VBG 136, deflected from its original path. The diffracted light 135 is incident upon a reflective surface 138, which may be formed on the VBG element itself, as shown in FIG. 2A, or provided as an external element, as shown in FIG. 2B. Upon being reflected by the surface 138, the reflected diffracted light 139 is redirected by the VBG element 136, as redirected light 137 back through the lens 134 and into the laser cavity of the laser 130. Thus, the laser 130 may be forced to operate at a wavelength determined by the VBG 136.

Figure 3:
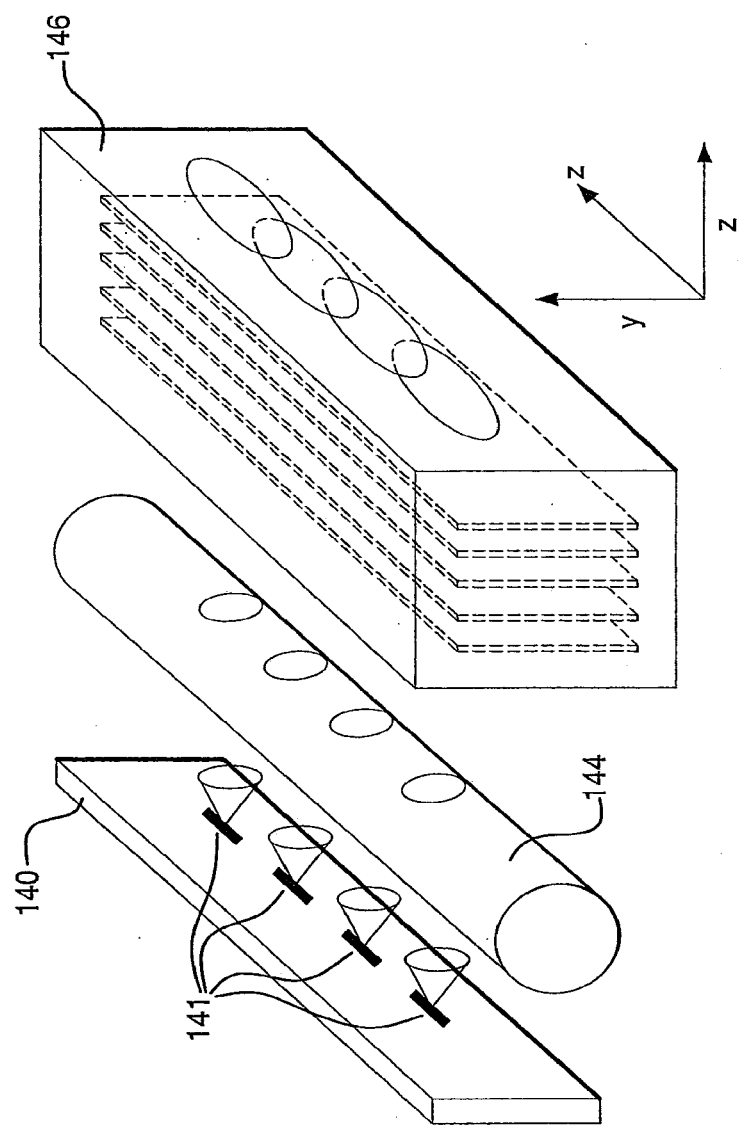
FIG. 3 depicts a wavelength stabilization concept for a high-power laser bar.

FIG. 3 depicts the output of a laser diode bar 140 locked by a single VBG element 146 using a single micro-lens 144. The radiation output by the laser diode bar 140 may be collimated on an axis (say, the y-axis as shown in FIG. 3) by the micro-lens 144, which may be a cylindrical lens, for example, and is incident upon the VBG element 146. The VBG element 146, which may have generally the same grating period through its entire volume, reflects at least a portion of the light back into the cavities of the individual emitters 141 in the bar 140. The effect produced on the output of the emitter array is essentially the same as on an individual emitter. As a result, the output of the entire bar 140 is locked to one wavelength determined by the VBG element 146.

Figure 4B:
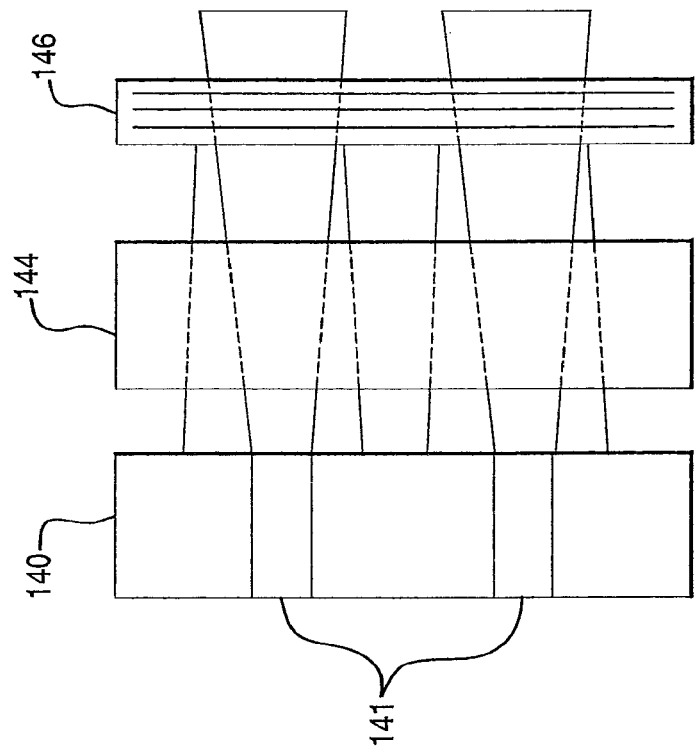
FIGS. 4A and 4B depict wavelength locking by self-seeding for a multi-mode laser diode bar.
Figure 4A:
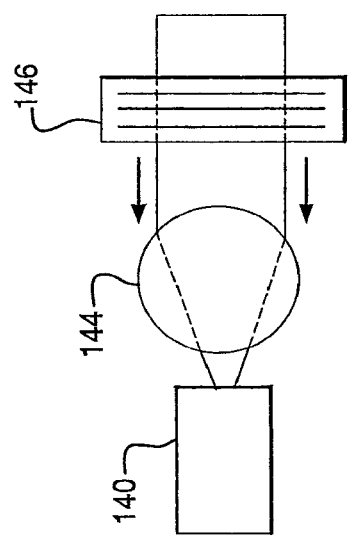

FIGS. 4A and 4B illustrate the use of a cylindrical lens 144 for locking a bar 140 of multimode laser diodes 141.

FIG. 4A shows a cross-section of the laser diode bar 140. The light emitted by the laser bar 140 may be collimated or reduced in divergence on the fast axis (y-axis as shown in FIG. 3) by the cylindrical lens 142 and is incident upon the VBG element 146. The VBG element 146 reflects some light back into the laser cavity. FIG. 4B shows the top view of the laser diode bar 140. The light emitted by the individual emitters 141 in the diode bar 140 is incident upon the cylindrical lens 142. The slow axis of the emitted light cone is not collimated. It is subsequently incident upon the VBG element and is reflected back onto the face of the diode bar.

Figure 5:
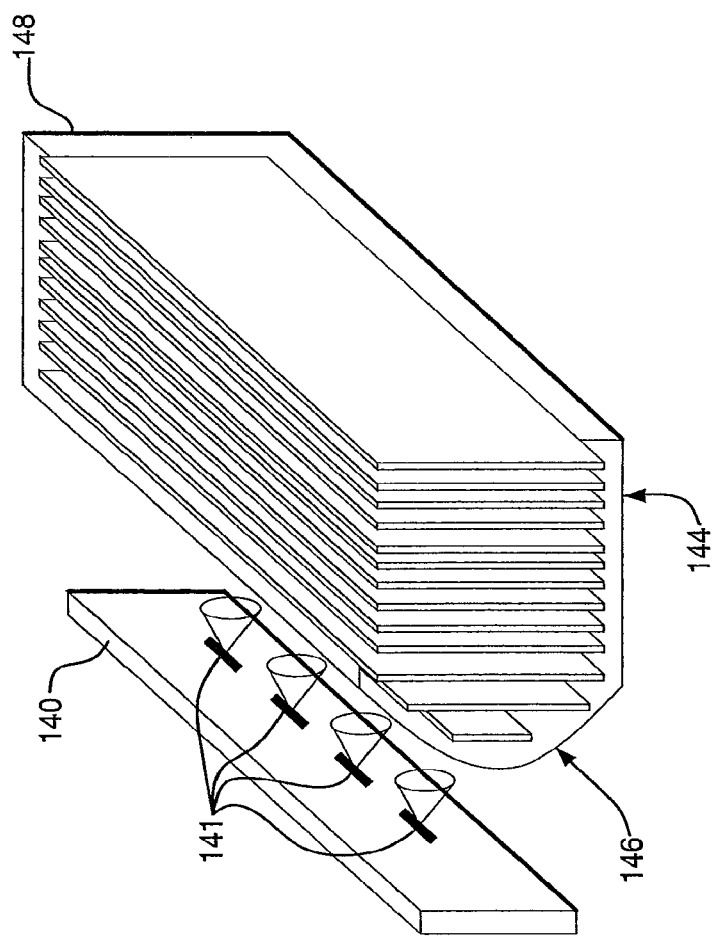
FIG. 5 depicts locking of a laser diode array by use of a hybrid element combining the fast axis collimating lens and a VBG.

FIG. 5 shows how a hybrid optical element 148, which may be a combined lens and VBG element, can be used for conditioning of an entire array 140 of emitters 141. The lens portion 146 of the hybrid optical element 148 can be formed directly on the surface of the VBG element 144 or seamlessly fused onto it.

Figure 6:
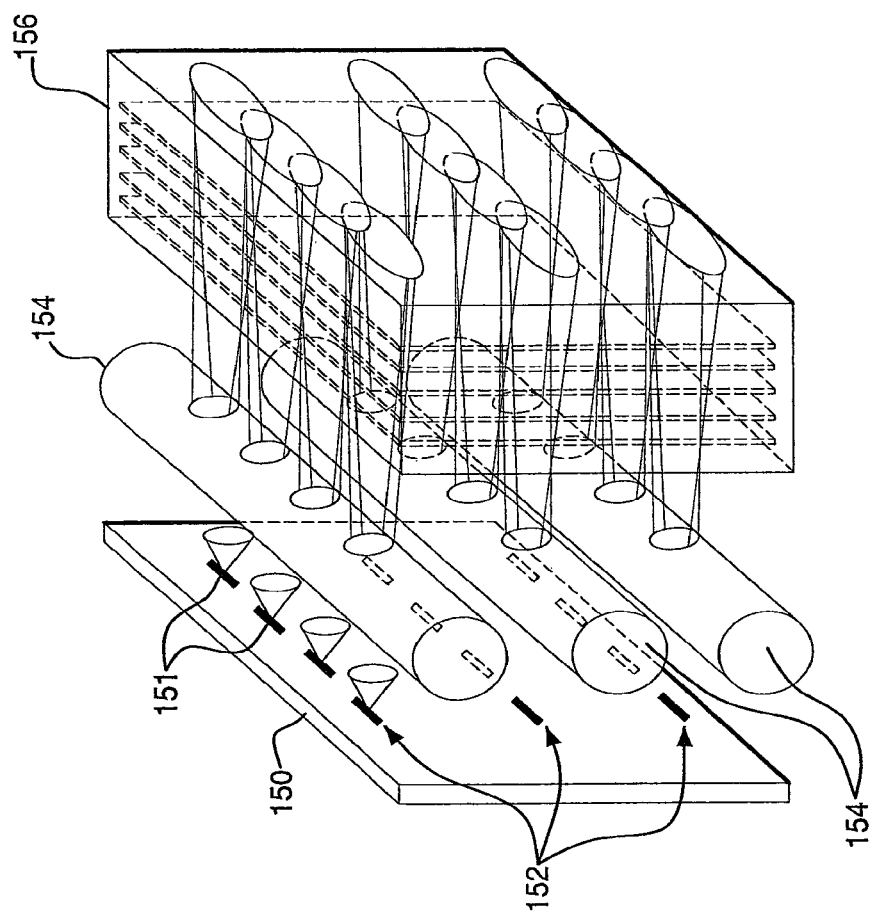
FIG. 6 depicts wavelength locking of laser diode stacks.

FIG. 6 shows the concept of locking a stack 150 of diode bars 151. There are several diode bars 152 in the stack 150, each of which includes a plurality of individual emitters 151 exposed at the face of the stack 150. The light emerging from the individual emitters 151 may be collimated by a set of cylindrical micro-lenses 154. Preferably, a respective lens 154 is provided for each diode bar 152 (though it should be understood that other lens arrangements may be used as well). The lenses 154 collimate the fast axes of the bars 152 and the emitted light subsequently enters the VBG element 156. The VBG element 156 may have essentially the same period grating through its entire volume. The VBG element 156 reflects at least a portion of the incident light back through the lenses 154 onto the face of the stack 150, with at least a portion of the reflected light entering the cavities of the individual emitters 151. The result is that the output of the entire stack 150 is locked to the same wavelength determined by the VBG element 156.

Figure 7:
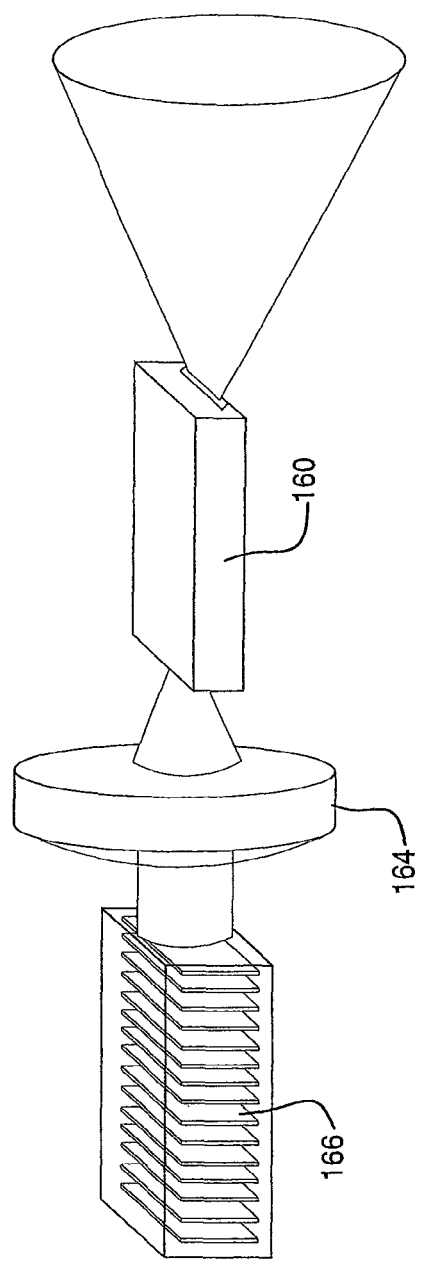
FIG. 7 depicts laser wavelength stabilization by self-seeding through a back-facet.

FIG. 7 depicts locking a light emitter 160 by placing a VBG element 166 behind the back facet of the emitter 160. The back facet of the emitter 160 is partially transmissive to light. The light exiting that facet is collimated by an optical delivery system (e.g., a lens) 164 and then is incident upon the VBG element 166. The VBG element 166 reflects at least a portion of this light back onto the back facet of the emitter 160, with at least a portion of the reflected light entering the laser cavity of the emitter 160. This results in locking the wavelength of the emitter 160 to that of the VBG element 166.

FIG. 8 depicts producing an array of emitters with different wavelength outputs. This concept may be applied to either one- or two-dimensional arrays. All the emitters 171 in the array 170 may be made from the same material, and, therefore, may have essentially the same natural output wavelength. The light emerging from the individual diode bars 172 in the stack 170 may be collimated by a set of cylindrical micro-lenses 174. Preferably, a respective lens 174 is provided for each diode bar 172 (though it should be understood that other lens arrangements may be used as well). The lenses 174 collimate the fast axes of the bars 172 and the emitted light subsequently enters the VBG element 176. The grating period of the VBG element 176 may differ depending on the location along the grating coordinate parallel to the laser bar(s) 172. The VBG element 176 reflects at least a portion of the incident light back onto the face of the stack 170, and at least a portion of the reflected light enters the cavities of the individual emitters 171. As a result, the emitting wavelength of the individual laser diodes 171 in the bar(s) 172 may be locked to different values depending on the location of the emitters 171 relative to the VBG 176.

Figure 9:
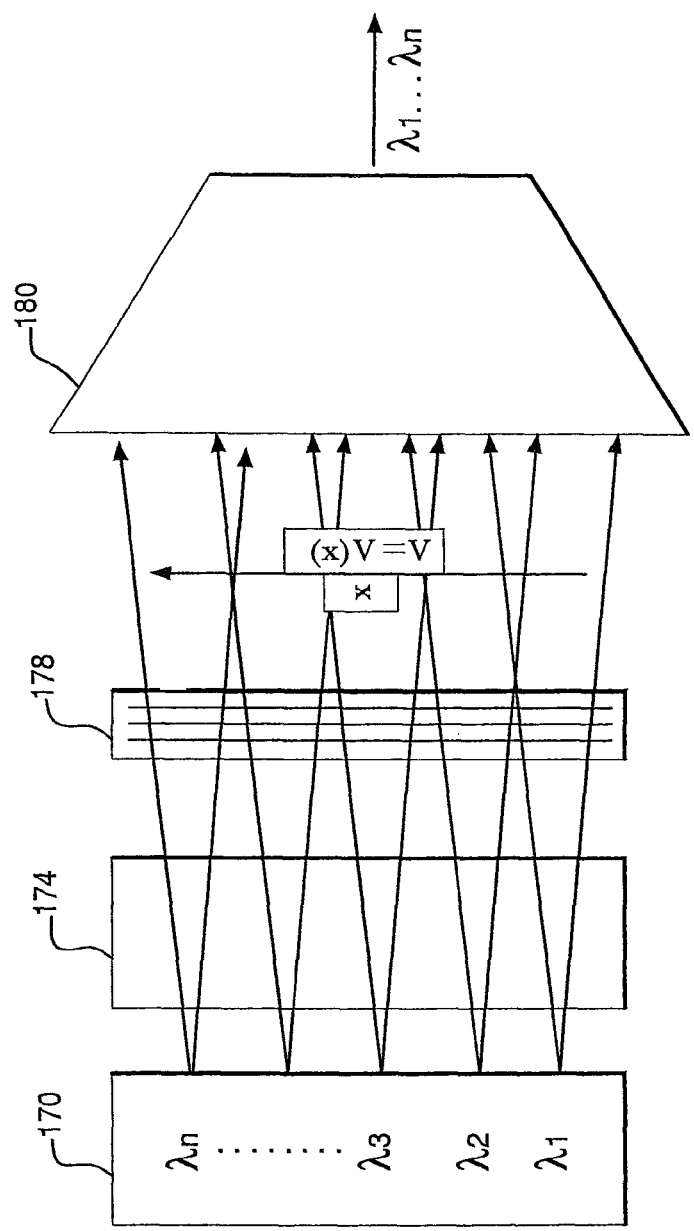
FIG. 9 depicts wavelength multiplexing of the output of a wavelength-shifted laser diode bar/stack for higher brightness.

FIG. 9 depicts wavelength multiplexing of the output of the wavelength-shifted laser diode bar/stack 170 described in FIG. 8 to produce a higher brightness light source. The output of an array of emitters 170 is conditioned by a lens or lens array 174 and subsequently enters a VBG element 178. The VBG element 178 has a grating period that may vary depending on the location along the grating coordinate parallel to the array of the emitters 170. The VBG element 178 thus forces the individual emitters to operate at different wavelengths depending on the location within the array.

The output of such a wavelength-shifted emitter array may be directed into a wavelength multiplexer 180 capable of multiplexing different wavelengths of light into a single output. Such a multiplexer 180 may be constructed using any of a number of well-established techniques, including, but not limited to diffraction gratings, VBG elements, thin-film dielectric filters, arrayed-waveguide grating(s), or any other optical elements or a combination of optical elements capable of delivering this basic function. The output of the entire emitter array 170 may thus be combined into a single spot with essentially all optical power of the entire array concentrated in one spot on a target (not shown), which can be or include, without limitation, an optical fiber, optical fiber array, detector, detector array, emitter, emitter array, solid-state material that needs to be processed (e.g., cut, welded, melted, etc.), liquid, gas, or the like.

Figure 10:
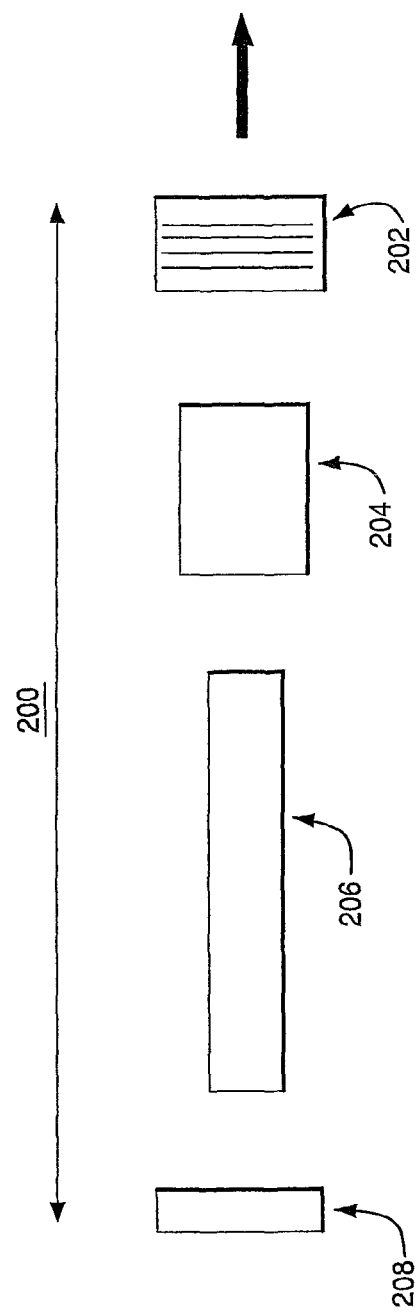
FIG. 10 depicts a VBG mirror forming part of a laser cavity.

FIG. 10 depicts a VBG element 202 inside a laser cavity 200. The laser cavity 200 may include one or more mirrors 208 (back facet, as shown, or front facet, not shown), a gain medium 206, conditioning optics 204, and a VBG element 202. Preferably, the gain medium 206 may be or include a solid-state, gas, or ion medium, and the conditioning optics may include lenses, mirrors, prisms, birefringent filters, and the like. It should be understood, however, that any type of gain medium and conditioning optics may be used. Also, the gaps shown in FIG. 10 between the individual components within the laser cavity 200 may or may not be employed. The function of the VBG 202 may be spectral, spatial, or temporal conditioning of the laser output.

Figure 11:
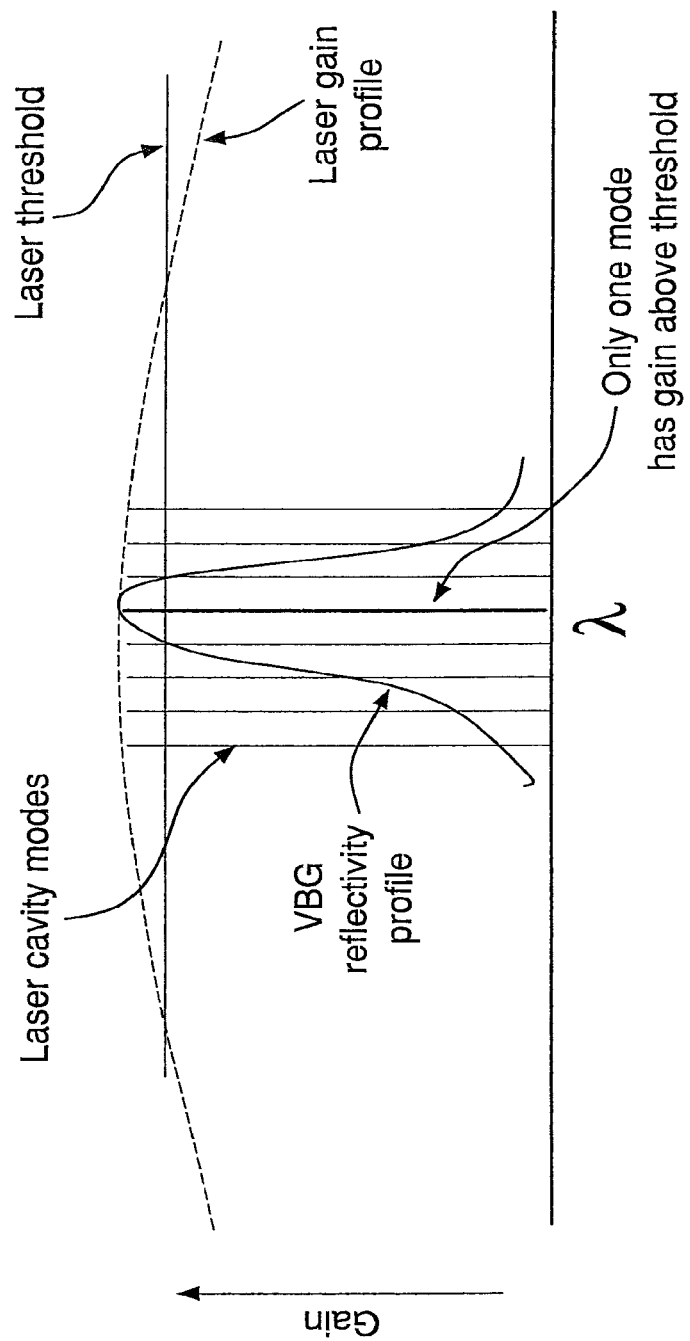
FIG. 11 depicts using a VBG for a single longitudinal laser mode selection.

FIG. 11 provides plots showing how a VBG element can force a laser to operate on a single longitudinal mode. As an example, a VBG element may be used as a partially reflective output coupler. The VBG element has a narrow wavelength reflectivity, considerably narrower than the width of the gain curve of the active medium of the laser. In order to laser, the individual longitudinal modes of the laser resonator have to exceed the lasing threshold. Due to the highly selective reflectivity of a VBG output coupler, however, only one longitudinal mode of the laser cavity has a gain exceeding the lasing threshold.

FIGS. 12A and 12B depict a VBG element used as a distributed feedback element of a solid-state laser. As shown in FIG. 12A, the VBG element 210 can serve as both the active medium and the feedback element. As shown in FIG. 12B, the VBG element 212 can be attached via an optical contact (e.g., fused) to the active medium 214. The resonator mode can be formed by either the VBG element itself or some additional elements. Both configurations can be used in free-space or waveguide applications.

Figure 13:
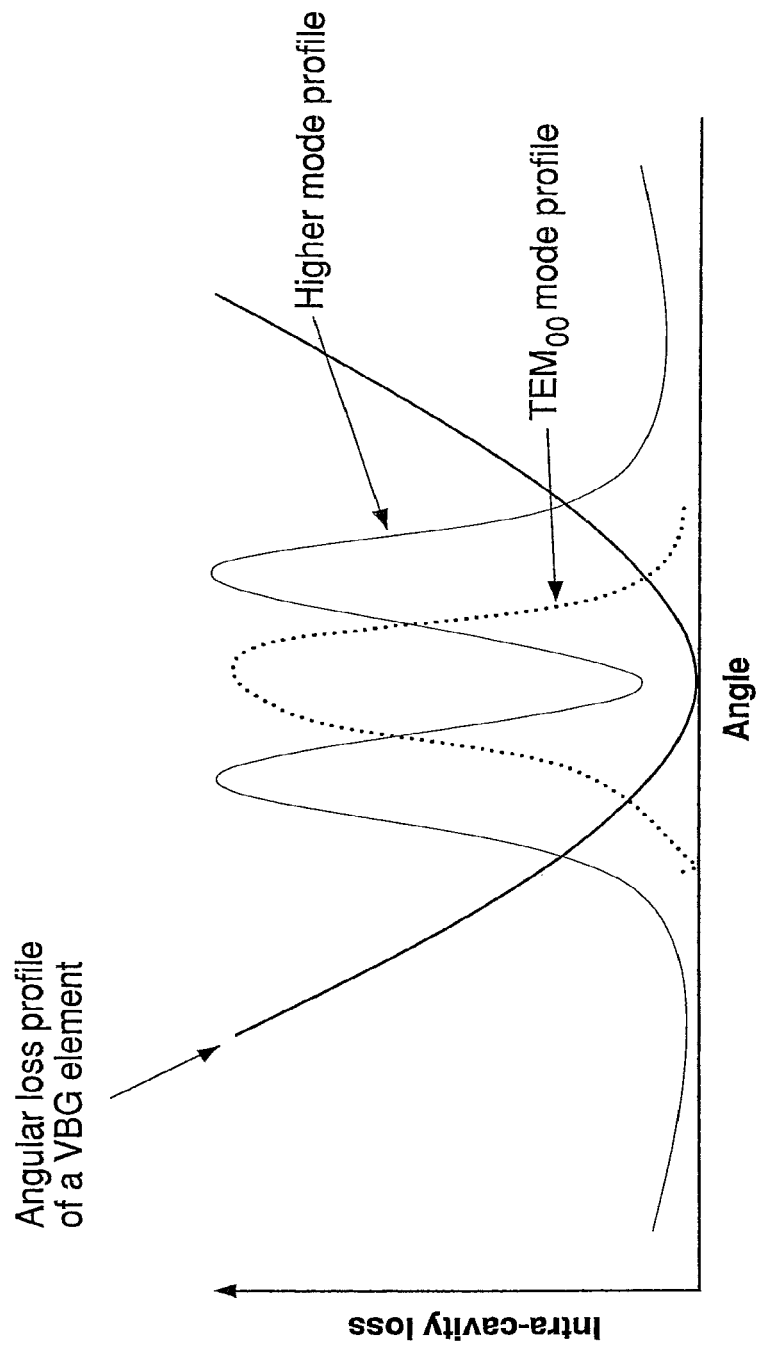
FIG. 13 depicts spatial mode stripping by use of a VBG.

Similar to narrow wavelength pass-band, a VBG element may have a narrow angle pass-band, as shown in FIG. 13. Preferably, the angular passband of the VBG element should be wider than the angular width of the $TEM_{00}$ mode of the laser cavity. Due to the relatively sharp roll-off of the diffraction efficiency of a VBG element with angle of incidence (the laser wavelength is fixed), a higher mode of the laser cavity will experience higher losses and, therefore, will be essentially suppressed by the VBG element. The VBG element thus functions to strip the laser from its higher spatial modes and force it to operate on the $TEM_{00}$ mode only.

Figure 14B:
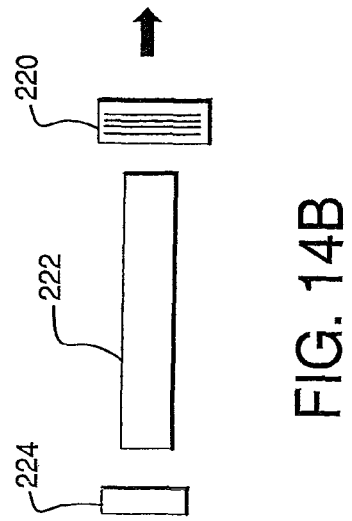
FIGS. 14A-14D depict examples of various angular diffraction efficiency profiles of VBG elements for spatial mode stripping in non-folding configurations.
Figure 14A:
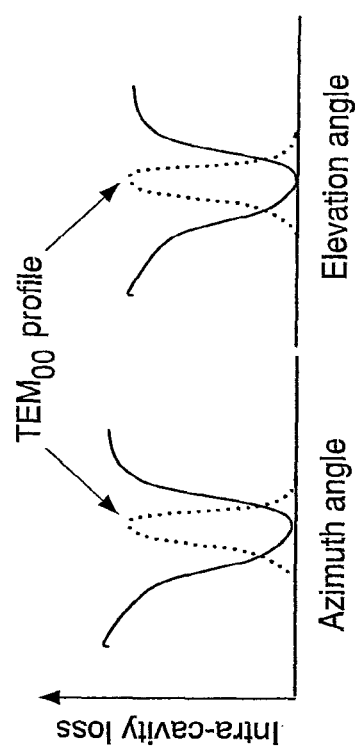

As shown in FIGS. 14A and 14B, the VBG element has a high diffraction efficiency for the $TEM_{00}$ mode only and produces higher loss for the higher spatial modes. The drawing on the right shows an embodiment of how it can be used in a laser cavity, comprising at least one mirror 224, a gain medium 222, and a VBG element 220 functioning as an output coupler. The VBG element 220 may have high reflectivity, and, therefore, low losses, only for the $TEM_{00}$ mode.

Figure 14C:
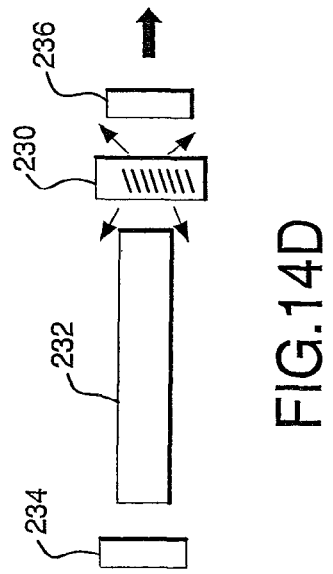
Figure 14D:
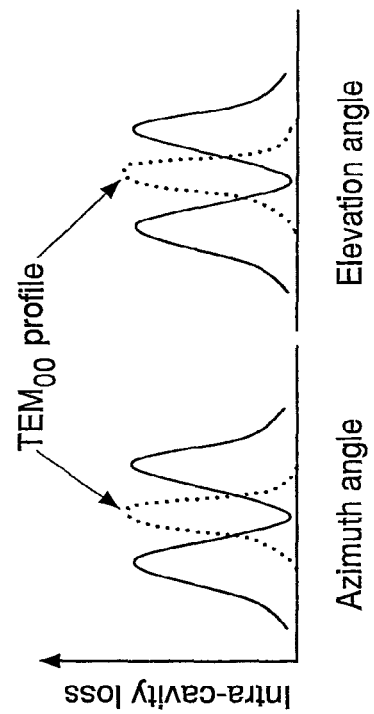

By contrast, as shown in FIGS. 14C and 14D, the VBG element 230 may have a diffraction efficiency profile with a dip at nearly normal incidence, both in azimuth and elevation angle profile. Therefore, it will have low loss for the $TEM_{00}$ mode in transmission. Such a VBG element 230 may be used as an essentially transparent (i.e., lossless) element inside the laser cavity, which may include at least one mirror 234 and a gain medium 232. Feedback may be provided by a conventional output coupler 236, for example, or by a VBG output coupler with angular diffraction efficiency profile as is shown in FIG. 14A.

In the embodiment shown in FIG. 14D, the higher spatial modes will experience diffraction on the VBG element 230 and, therefore, will be directed out of the cavity, producing higher losses for those modes and, therefore, eliminating them. In either case the result is $TEM_{00}$ output of the laser. VBG elements of both transmission and reflection type can be used to achieve $TEM_{00}$ operation. The embodiments depicted in FIGS. 14B and 14D are of the so-called "non-folding" type.

FIG. 15 shows a concept for using a reflective VBG element with smoothly varying reflectivity profile ("soft aperture") for inducing simultaneously single longitudinal mode operation of a laser as well as $TEM_{00}$-only operation. The VBG element 232 depicted in FIG. 15 functions as the output coupler of the laser cavity 230, and is axially symmetric around the resonator axis Z. The laser cavity 230 may include a high-reflectivity mirror 236 and a gain medium 234.

Figure 16:
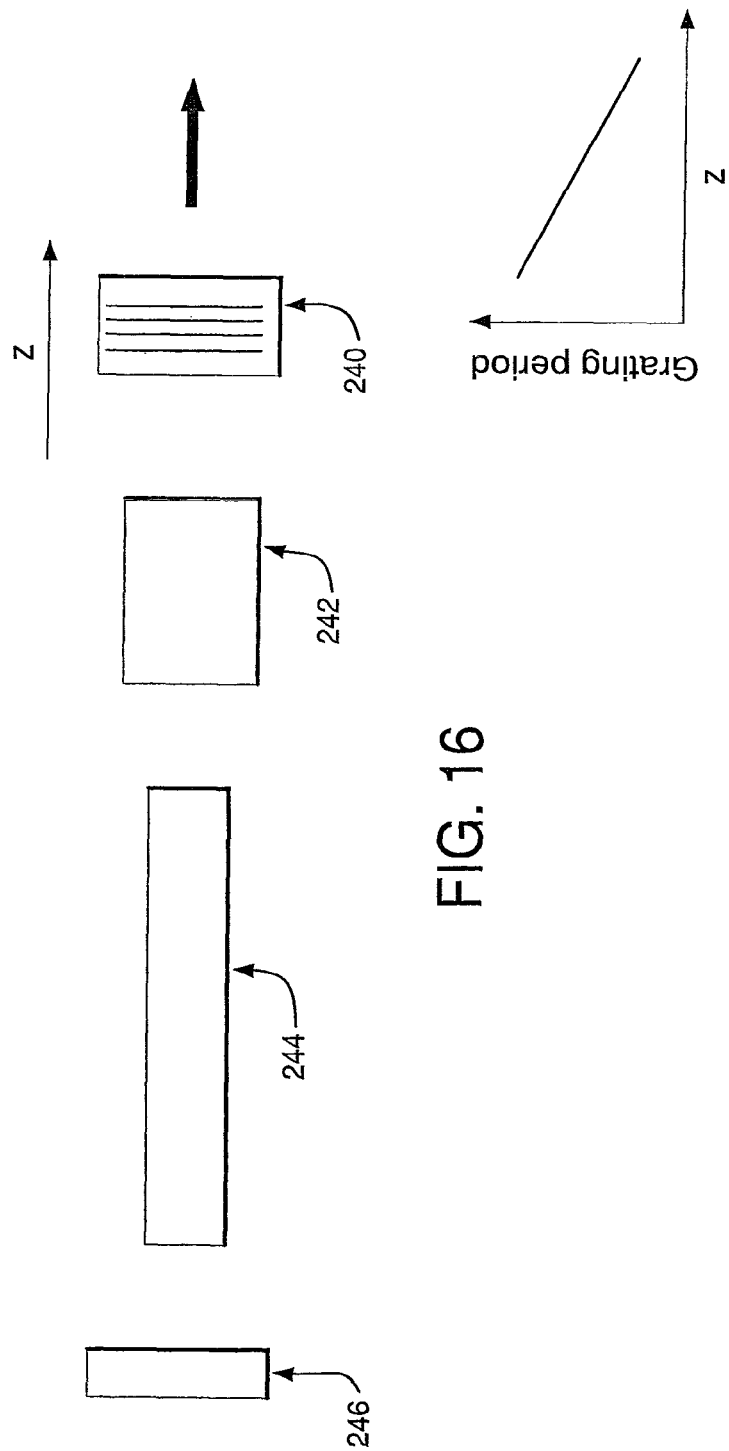
FIG. 16 depicts conditioning of the temporal profile of pulsed lasers.

FIG. 16 depicts an embodiment suitable for shaping the temporal profile of ultra-short laser pulses. In this embodiment, a VBG element 240 may be used inside a laser cavity having at least one mirror 246, a gain medium 244, and other optics 242 (such as lenses, prisms, gratings, and the like). It is known that ultra-short laser pulses (e.g., <10 ps duration) have wide spectral range and will, therefore, likely experience dispersion inside the gain medium. The gain medium may be bulk solid-state, fiber, planar waveguide or any other. Such dispersion is generally undesirable because it leads to broadening of the ultra-short laser pulse. In accordance with an aspect of the invention, the VBG element 240 may be manufactured with a grating period that varies slightly along the axis, z, of the laser. Such a grating may produce slightly different delays for different wavelengths and, therefore, will compensate for the dispersion of the gain medium 244 of the laser. This improves the temporal characteristics of the laser pulse. Alternatively, the same technique may be used for compression of the chirped and stretched high peak power ultra-short pulses subsequent to their amplification in an optical amplifier. The pulses must be stretched prior to the amplification to avoid damage to the amplifier as well as nonlinear effects.

FIGS. 17A-C depict a VBG element used to construct tunable devices. As shown in FIGS. 17A and 17B, light emerging from the cavity of an emitter 250 may be collimated by a lens 252, if necessary, and incident upon a VBG element 254/264. FIG. 17A shows an embodiment using a reflective-type VBG element 254; FIG. 17B shows an embodiment using a transmissive-type VBG element 256. The VBG element 254/264 reflects or deflects the incident light at an angle onto a folding mirror/reflector 256. The folding mirror 256 may then redirect the light to a retro-reflector 258, which reflects the light back on its path. The light retraces it path back into the cavity of the emitter 250, forcing the emitter 250 to operate at the peak wavelength of the VBG filter. Since the peak wavelength of a VBG element 254/264 depends on the incident angle, rotation of the VBG/folding reflector assembly continuously tunes the emitted wavelength of light.

As shown in FIG. 17C, light emerging from the cavity of an emitter 270 may be collimated by a lens 272, if necessary, and incident upon a VBG element 274. The VBG element 274 may have a period and peak wavelength that vary smoothly and continuously as a function of position across its clear aperture. Thus, the device may include a transverse chirp VBG reflector. When such a VBG element is translated across the output beam of the laser the wavelength of the laser emission will change to follow that of the particular location on the VBG element 274. It should be understood that, in the absence of an emitter, the VBG element (plus auxiliary optics) shown in FIGS. 17A-17C may function as a tunable filter.

FIGS. 18A and 18B depict spectral/spatial conditioning of an array of emitters with simultaneous wavelength combining/multiplexing. The light emitted by each of the emitters in the array 284 is depicted going though a particular channel in a wavelength multiplexer 282 positioned in the optical path of light emitted by the array 284. The multiplexer 282 combines all different wavelength channels 286 into one output channel. The multiplexed light is partially reflected by a retro-reflecting device 280 and the reflected portion of the light retraces its path back into the different emitters in the array 284. As a result, each emitter in the array 284 receives wavelength-selective feedback and, therefore, will be forced to operate at the wavelength of the multiplexer channel 286 it is coupled to. Efficient spectral and spatial conditioning can be achieved in this way with simultaneous combining of the output of all the emitters in the array. FIG. 18B depicts an embodiment where such a multiplexer 282 is constructed of a monolithic glass chip with wavelength-specific VBG nodes 288 recorded in its bulk.

Figure 19:
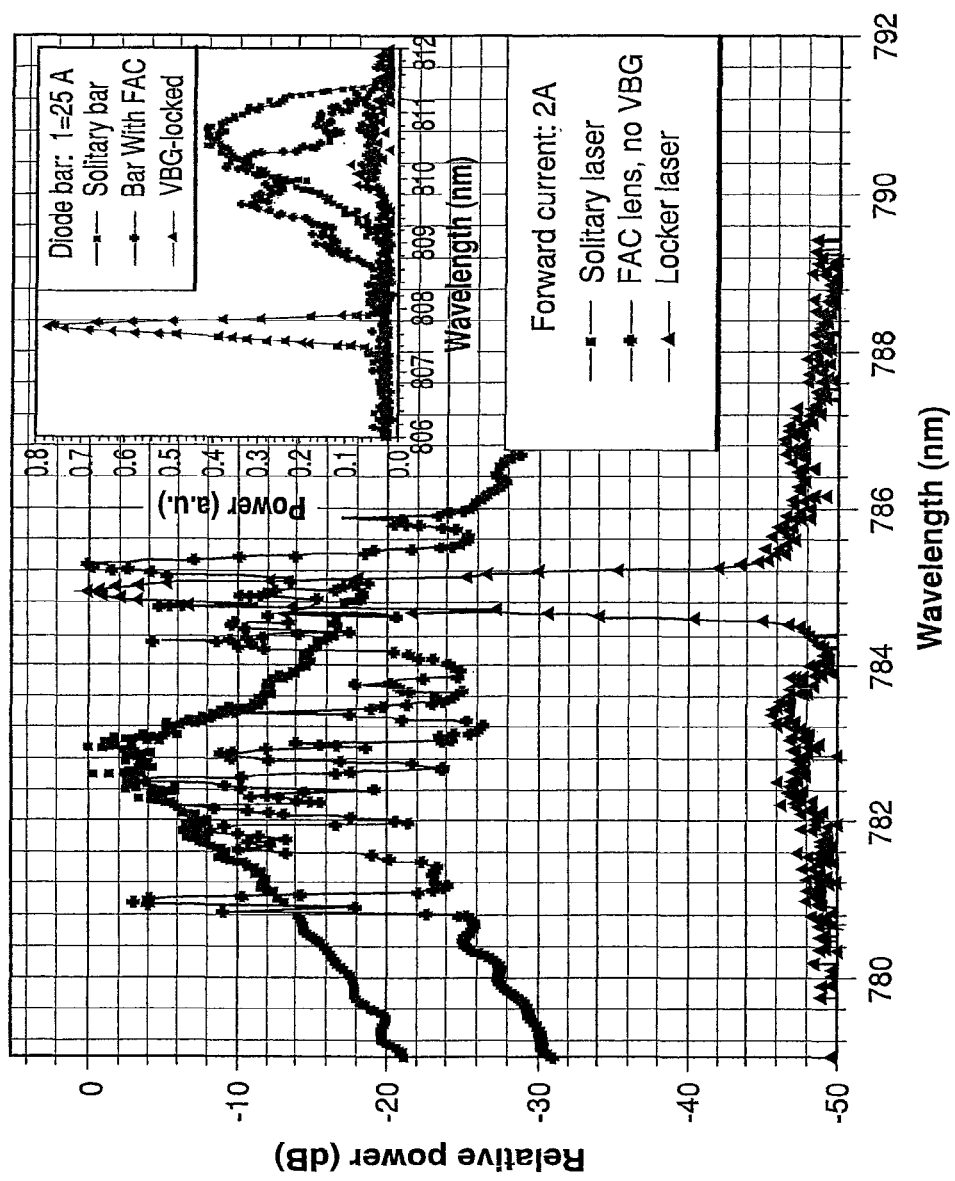
FIG. 19 depicts the results of spectral conditioning of laser diodes by use of VBG in extra-cavity configuration.

FIG. 19 provides a comparison of the output spectrums of free-running and VBG-locked, single-emitter lasers. The laser diode parameters were: 2 mm cavity length, 1×100 nm emitting aperture, and approximately 0.5% front facet reflectivity. The VBG parameters were: approximately 30% maximum reflectivity, and 0.84 mm thickness. Shown in the inset is a comparison of the output spectrums of free-running and VBG-locked laser diode bars. The laser bar parameters were: 19 emitters, 1×150 nm emitting aperture for each emitter, and approximately 17% front facet reflectivity. The VBG parameters were: approximately 60% maximum reflectivity, and 0.9 mm thickness.

Figure 20:
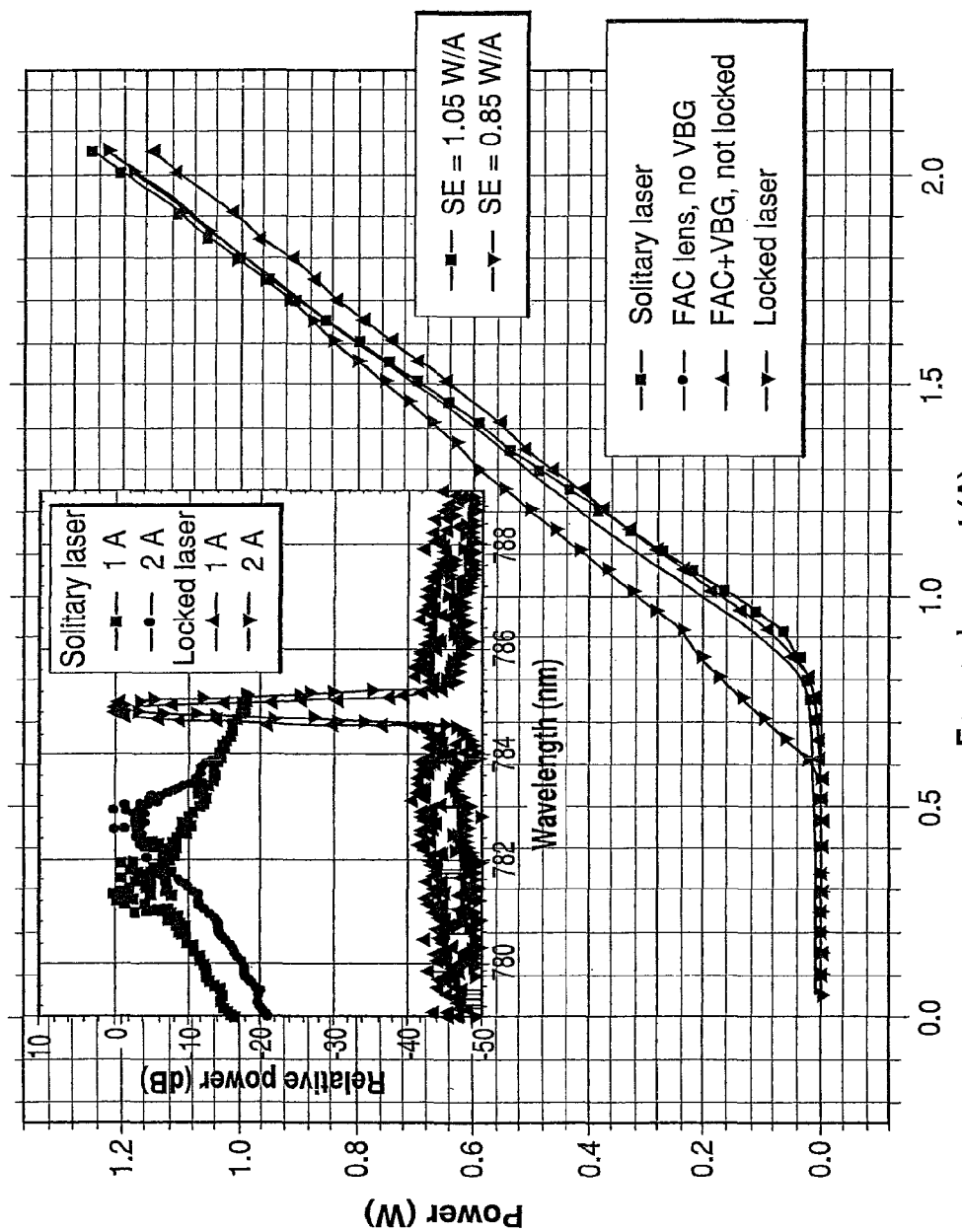
FIG. 20 depicts the output power characteristics of a laser diode locked by an external VBG element.

FIG. 20 provides plots of output power vs. current for a single-emitter laser diode under different conditions. The laser diode and the VBG parameters were the same as those described in connection with FIG. 19. The inset provides plots of emission spectra of the laser diode at different currents when free-running and locked by the VBG.

Figure 21:
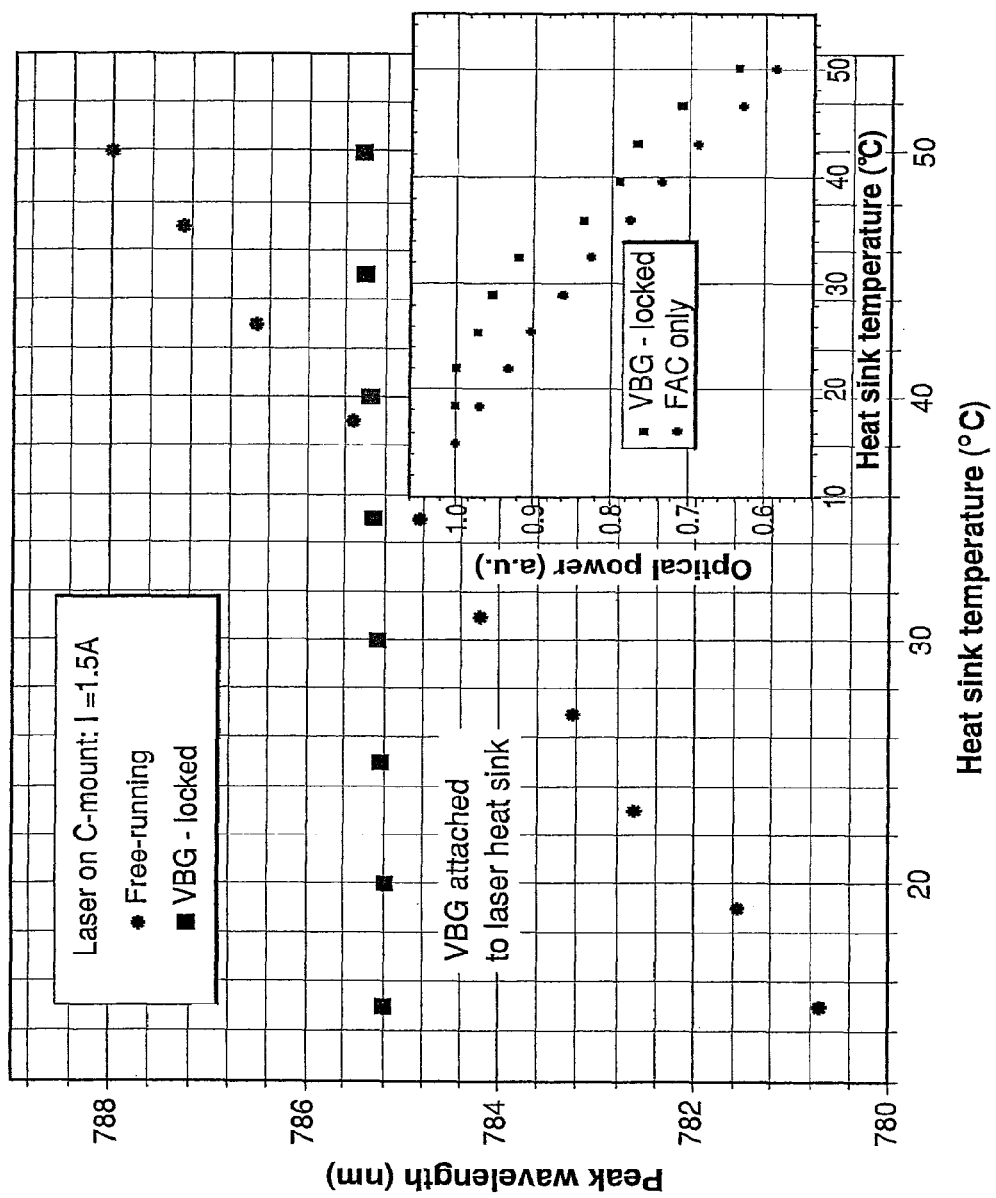
FIG. 21 depicts the results on the improvement in thermal drift of a laser diode locked by an external VBG element.

FIG. 21 provides plots of emission wavelength of a single-emitter laser diode as a function of the heatsink temperature when free running w/o FAC lens (circles) and locked by a VBG (squares). Drive current was 1.5 A in both cases. The VBG element was attached to the laser heatsink during the experiment. Shown in the inset is a plot of output power of a locked laser diode (squares) and a fast-axis collimated laser diode (circles) as a function of its heatsink temperature.

Figure 22:
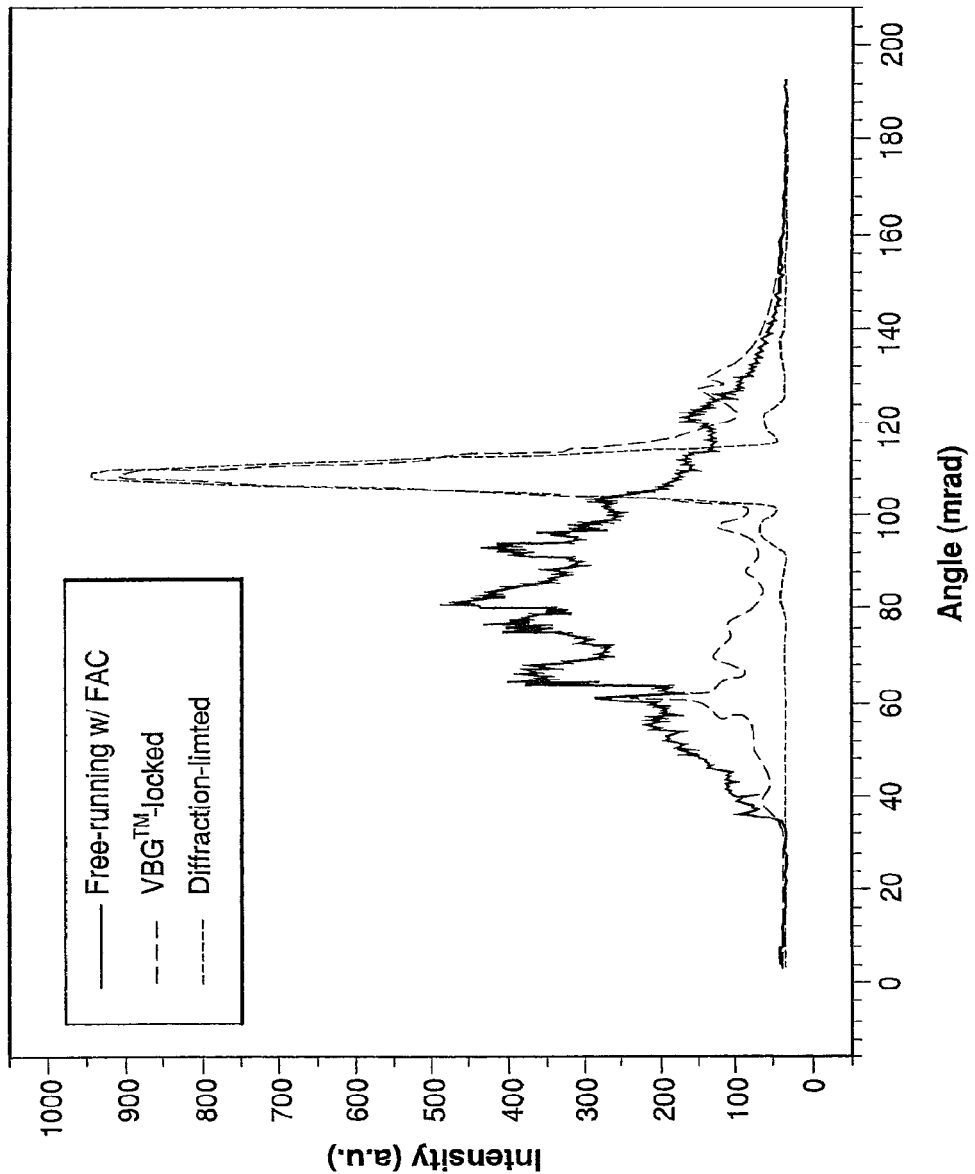
FIG. 22 depicts the results in improving spatial characteristics of a laser diode locked by an external VBG element.

FIG. 22 provides plots that demonstrate the effect of VBG locking on the divergence of the slow axis of a single-emitter laser diode. The dotted curve shows the calculated far-field pattern of the light diffracted on the exit aperture of the laser diode.

FIGS. 23A and 23B depict extra-cavity doubling of a high-power laser diode frequency. As shown in FIG. 23A, light emitted by a laser diode 302 with a high-reflectivity (HR) coating on the back facet and an anti-reflection (AR) coating on the front facet is collimated by a lens 304 and is incident upon a VBG element 306. The VBG element 306 reflects a certain amount of light in a narrow spectral region. The reflected light is directed back into the cavity of the laser diode 302, thus locking the frequency of the laser emission to that of the peak reflectivity of the VBG element 306. The VBG element 306 also narrows the emission bandwidth of the laser 302, making it equal to or smaller than the acceptance bandwidth of the quasi-phase-matched (QPM) nonlinear crystal 310. The nonlinear crystal 310 is periodically poled to achieve QPM. The light that passes through the VBG element 306 may be focused into the QPM crystal 310 by a lens 308. The QPM crystal 310 generates the second harmonic of the light emitted by the laser diode 302. The QPM crystal 310 preferably has AR coating for the fundamental and the second harmonic on both facets. Light out of the QPM crystal 310 may be redirected through another lens 312.

As shown in FIG. 23B, the VBG element 326 locks the frequency and narrows the emission spectrum of the laser diode 322. The laser diode 322 may have the same characteristics as described above in connection with FIG. 23A. The emitted light is focused into a QPM nonlinear waveguide 330, which generates the second harmonic of the incident light. The QPM nonlinear waveguide 330 preferably has AR coating for the fundamental and the second harmonic on both facets. Lenses 324, 328, and 332 may be provided as desired.

Figure 24C:
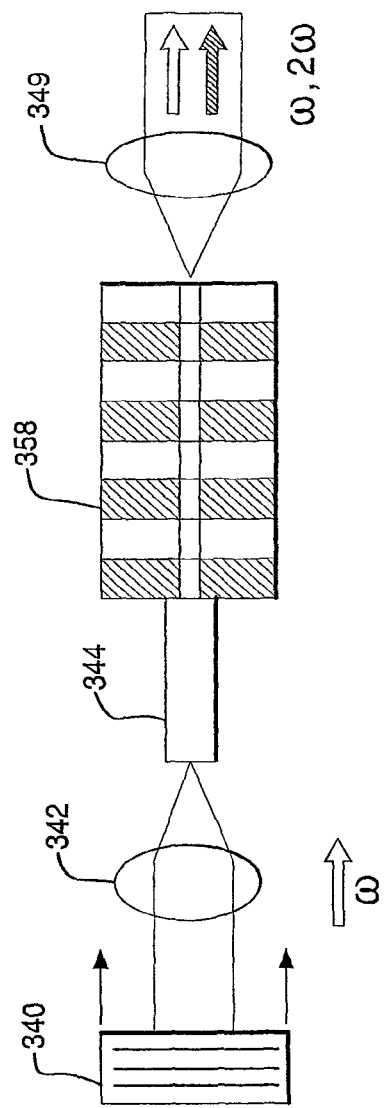

FIGS. 24A-C depict extra-cavity doubling of a high-power laser diode frequency. Light emitted through the back facet by a laser diode 344 with AR coating on both facets is collimated by a lens 342 and is incident upon a VBG element 340. The VBG element 340 reflects most of the light in a narrow spectral region. The reflected light is directed back into the laser cavity, thus forming an external cavity and locking the frequency of the laser emission to that of the peak reflectivity of the VBG element 340. The front facet of the laser 344 should have enough reflectivity for the laser 344 to operate above threshold and at a desired output power level. The VBG element 340 also narrows the emission bandwidth of the laser 344, making it equal to or smaller than the acceptance bandwidth of the quasi-phase-matched (QPM) nonlinear crystal 348. A lens 346 may be used to focus the light into the QPM crystal 348, which then generates the second harmonic of the incident light. The QPM crystal 348 preferably has AR coating for the fundamental and the second harmonic on both facets. A lens 349 may be used to focus the light output from the QPM crystal.

As shown in FIG. 24B, the light emitted by the laser diode 344 may be focused into a QPM nonlinear waveguide 358, via a lens 356. The waveguide 358 may generate the second harmonic of the incident light. The QPM nonlinear waveguide 358 preferably has AR coating for the fundamental and the second harmonic on both facets. As shown in FIG. 24C, the QPM nonlinear waveguide 358 abuts the laser diode 344 so that most of the light emitted by the laser diode 344 is coupled into the QPM waveguide 358.

FIGS. 25A and 25B depict intra-cavity doubling of a high-power laser diode frequency. FIG. 25A depicts a high-power laser diode 370 having HR coating on the back facet and very low reflectivity AR coating on the front facet. The external cavity of the laser diode 370 may be formed by a VBG element 371 positioned after a collimating lens 379. A QPM crystal 378 may be placed between the VBG element 371 and the front facet of the laser diode 370, and between a lens pair 376, 379 that focuses the light into the QPM crystal 378. By having the QPM crystal 378 positioned inside the external cavity of the laser diode 370, the power of the fundamental harmonic of the laser diode 370 can be increased, thus increasing the conversion efficiency from the fundamental to the second harmonic. A window 374 with AR coating for the fundamental harmonic and HR coating for the second harmonic can be placed between the front facet of the laser diode 370 and the QPM crystal 378 in order to increase the total power of the second harmonic emitted by this device. The QPM crystal 378 preferably has AR coating for the fundamental and the second harmonic on both facets.

As shown in FIG. 25B, the laser diode 370 may abut a QPM nonlinear waveguide 388. Preferably, the waveguide 388 has AR coating for the fundamental harmonic of light emitted by the laser diode 370 and HR coating for the second harmonic on its front facet (i.e., the one facing the laser diode 370). The back facet of the QPM nonlinear waveguide 388 preferably has AR coating for both the fundamental and the second harmonic.

Thus, there have been described example embodiments of apparatus and methods for conditioning laser characteristics using volume Bragg grating elements. It will be appreciated that modifications may be made to the disclosed embodiments without departing from the spirit of the invention. The scope of protection, therefore, is defined by the following claims.

In the manufacturing of VBG elements, it is typically desirable to minimize the costs of production of such elements. For that reason, holographic recording of each element individually is likely to be cost-prohibitive for most or all of the high-volume applications. A method for cost-effective production of such elements will now be described.

Figure 26:
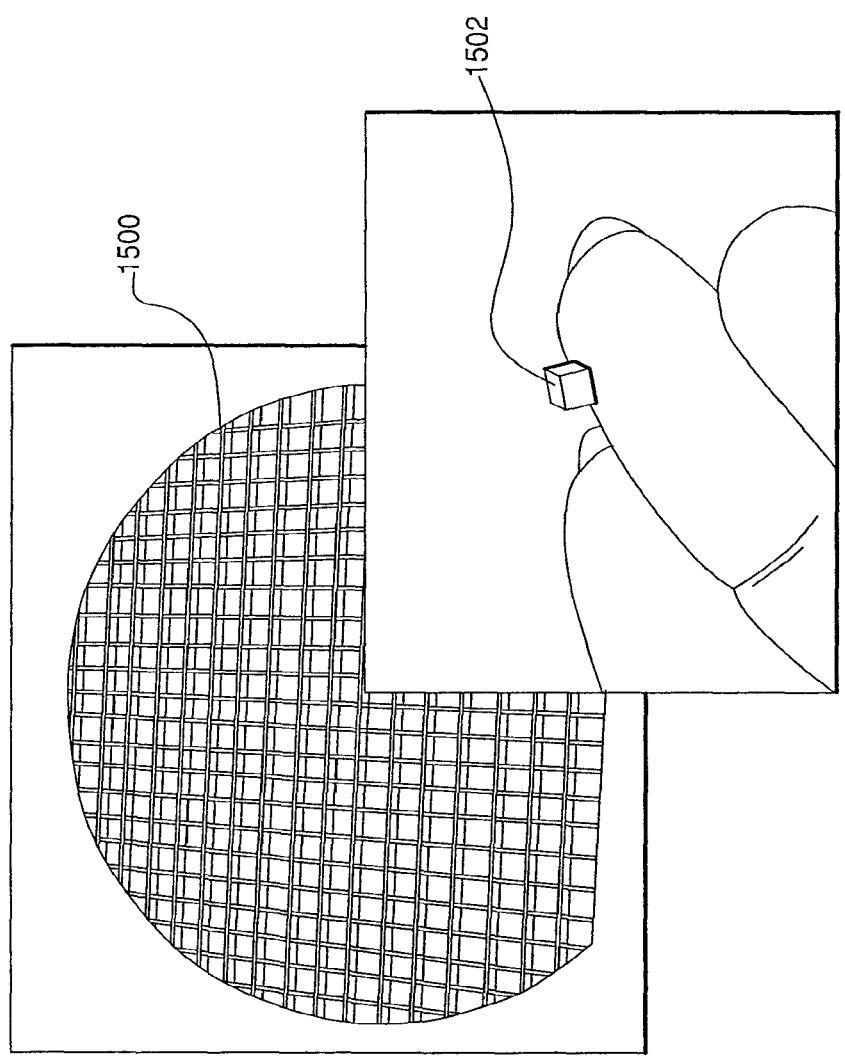
FIG. 26 depicts a method for fabricating VBG elements.

Such a method, depicted in FIG. 26, exploits the unique property of a hologram, whereupon each fractional piece of the recorded hologram possesses full and complete information about the recorded object. When applied to the VBG filters recorded on the PRG plates, it means that each piece of such plate, or wafer, should have the same filtering properties as the wafer in whole. For that reason, a large-size wafer 1500 can be diced, using a suitable cutting device, such as a saw, for example, into a large number of relatively small individual VBG elements 1502, each with complete filter functionality. In following this process, one could significantly reduce the number of recording and testing operations, thereby reducing the manufacturing costs of the VBG elements.

What is claimed:

1. Apparatus for producing high peak power ultra-short pulses, the apparatus comprising:
   a first volume Bragg grating element comprising a three-dimensional bulk of optical material having a first Bragg grating formed therein, said first Bragg grating defining a first Bragg grating vector and having a first grating period that varies as a function of position along the first Bragg grating vector;
   an optical amplifier; and
   a second volume Bragg grating element comprising a three-dimensional bulk of optical material having a second Bragg grating formed therein, said second Bragg grating defining a second Bragg grating vector and having a second grating period that varies as a function of position along the second Bragg grating vector;
   wherein the first volume Bragg grating element is adapted to receive an incident laser pulse, to stretch the incident laser pulse to form a stretched laser pulse, and to provide the stretched laser pulse to the optical amplifier,
   wherein the optical amplifier is adapted to receive the stretched laser pulse, to amplify the stretched laser pulse to form an amplified stretched pulse, and to provide the amplified stretched pulse to the second volume Bragg grating element, and
   wherein the second volume Bragg grating element is adapted to receive the amplified stretched pulse from the optical amplifier, and to compress the amplified stretched laser pulse to form a compressed amplified laser pulse.

2. The apparatus of claim 1, wherein the incident laser pulse has a first peak power and the compressed amplified laser pulse has a second peak power that is greater than the first peak power.

3. The apparatus of claim 2, wherein the incident laser pulse has a first pulse width and the compressed amplified laser pulse has a second pulse width that is approximately equal to the first pulse width.

4. The apparatus of claim 1, wherein the incident laser pulse has a first pulse width and the stretched laser pulse has a second pulse width that is greater than the first pulse width.

5. The apparatus of claim 1, wherein the stretched laser pulse has a first pulse width and the compressed amplified laser pulse has a second pulse width that is less than the first pulse width.

6. The apparatus of claim 1, wherein the incident laser pulse has a pulse width of less than 10 picoseconds.

7. The apparatus of claim 2, wherein the incident laser pulse has a pulse width of less than 10 picoseconds.

8. The apparatus of claim 3, wherein the incident laser pulse has a pulse width of less than 10 picoseconds.

9. The apparatus of claim 1, wherein the first and second volume Bragg grating elements are the same element.

10. The apparatus of claim 9, wherein the first volume Bragg grating element defines a first aperture and a second aperture opposite the first aperture, and
    wherein the first volume Bragg grating element is adapted to receive the incident laser pulse via the first aperture, and to receive the amplified stretched pulse via the second aperture.

11. The apparatus of claim 10, wherein the first aperture defines a first plane, and the Bragg grating vector is normal to the first plane.

12. The apparatus of claim 11, wherein the second aperture defines a second plane, and the Bragg grating vector is normal to the second plane.

13. The apparatus of claim 10, wherein the second aperture defines a plane, and the Bragg grating vector is normal to the plane defined by the second aperture.

* * * * *